(12) United States Patent
Yeon et al.

(10) Patent No.: US 12,745,498 B2
(45) Date of Patent: Sep. 22, 2026

(54) DISPLAY APPARATUS COMPRISING AN ELECTRODE HAVING A STEP DIFFERENCE

(71) Applicant: SAMSUNG ELECTRONICS CO., LTD., Suwon-si (KR)

(72) Inventors: Jihye Yeon, Suwon-si (KR); Hankyu Seong, Suwon-si (KR); Suhyun Jo, Suwon-si (KR); Sammook Kang, Suwon-si (KR); Mihyun Kim, Suwon-si (KR); Kyungwook Hwang, Suwon-si (KR); Junsik Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 454 days.

(21) Appl. No.: 18/218,664

(22) Filed: Jul. 6, 2023

(65) Prior Publication Data

US 2024/0021661 A1 Jan. 18, 2024

(30) Foreign Application Priority Data

Jul. 15, 2022 (KR) ........................ 10-2022-0087471
Apr. 4, 2023 (KR) ........................ 10-2023-0044277

(51) Int. Cl.
*H10H 29/14* (2025.01)
*H10H 20/831* (2025.01)
*H10H 20/851* (2025.01)

(52) U.S. Cl.
CPC ...... *H10H 29/142* (2025.01); *H10H 20/8312* (2025.01); *H10H 20/8512* (2025.01)

(58) Field of Classification Search
CPC .............. H10D 62/115; H01L 21/3212; H01L 21/76229; H10B 63/10; H10H 29/142;
(Continued)

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

CN 113328014 A 8/2021
CN 110416244 B 10/2021
(Continued)

*Primary Examiner* — Tracie Y Green
(74) *Attorney, Agent, or Firm* — Muir Patent Law, PLLC

(57) ABSTRACT

A display apparatus, including a circuit substrate including driver circuits and first bonding electrodes, and a pixel array on the circuit substrate and including a plurality of pixels each including first to third sub-pixels, and second bonding electrodes bonded to the first bonding electrodes, the pixel array further including, a plurality of first LED cells corresponding to the first and third sub-pixels, respectively, and each including a first conductivity-type semiconductor layer, a first active layer, and a second conductivity-type semiconductor layer, a plurality of second LED cells corresponding to the second sub-pixels, respectively, and each including the first conductivity-type semiconductor layer, a second active layer, and the second conductivity-type semiconductor layer, a first electrode extending to cover upper surfaces of the plurality of first and second LED cells and connected to the first conductivity-type semiconductor layers in common.

20 Claims, 21 Drawing Sheets

(58) Field of Classification Search
CPC ........... H10H 20/8312; H10H 20/8512; H10H 20/855
See application file for complete search history.

(56) References Cited

U.S. PATENT DOCUMENTS

| | | | |
|---|---|---|---|
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |
| 7,319,044 | B2 | 1/2008 | Han et al. |
| 7,501,656 | B2 | 3/2009 | Han et al. |
| 7,709,857 | B2 | 5/2010 | Kim et al. |
| 7,759,140 | B2 | 7/2010 | Lee et al. |
| 7,781,727 | B2 | 8/2010 | Sherrer et al. |
| 7,790,482 | B2 | 9/2010 | Han et al. |
| 7,940,350 | B2 | 5/2011 | Jeong |
| 7,959,312 | B2 | 6/2011 | Yoo et al. |
| 7,964,881 | B2 | 6/2011 | Choi et al. |
| 7,985,976 | B2 | 7/2011 | Choi et al. |
| 7,994,525 | B2 | 8/2011 | Lee et al. |
| 8,008,683 | B2 | 8/2011 | Choi et al. |
| 8,013,352 | B2 | 9/2011 | Lee et al. |
| 8,049,161 | B2 | 11/2011 | Sherrer et al. |
| 8,129,711 | B2 | 3/2012 | Kang et al. |
| 8,179,938 | B2 | 5/2012 | Kim |
| 8,263,987 | B2 | 9/2012 | Choi et al. |
| 8,324,646 | B2 | 12/2012 | Lee et al. |
| 8,399,944 | B2 | 3/2013 | Kwak et al. |
| 8,432,511 | B2 | 4/2013 | Jeong |
| 8,459,832 | B2 | 6/2013 | Kim |
| 8,502,242 | B2 | 8/2013 | Kim |
| 8,536,604 | B2 | 9/2013 | Kwak et al. |
| 8,735,931 | B2 | 5/2014 | Han et al. |
| 8,766,295 | B2 | 7/2014 | Kim |
| 9,722,145 | B2 | 8/2017 | Sasaki et al. |
| 10,700,052 | B2 | 6/2020 | Ninan et al. |
| 11,239,215 | B2 | 2/2022 | Choi et al. |
| 12,288,773 | B2 * | 4/2025 | Yeon ................... H01L 25/0753 |
| 2005/0199922 | A1 * | 9/2005 | Park ...................... H10F 39/805 257/292 |
| 2018/0269191 | A1 * | 9/2018 | England .............. H01L 25/0753 |
| 2023/0037888 | A1 | 2/2023 | Yeon |

FOREIGN PATENT DOCUMENTS

| | | |
|---|---|---|
| CN | 113921680 A | 1/2022 |
| CN | 111564121 B | 4/2022 |

* cited by examiner

DISPLAY APPARATUS COMPRISING AN ELECTRODE HAVING A STEP DIFFERENCE

CROSS-REFERENCE TO RELATED APPLICATION(S)

Korean Patent Application No. 10-2023-0044277, filed on Apr. 4, 2023, and Korean Patent Application No. 10-2022-0087471, filed on Jul. 15, 2022, in the Korean Intellectual Property Office, are incorporated herein by reference in their entirety.

BACKGROUND

1. Field

A display apparatus is disclosed.

2. Description of the Related Art

A semiconductor light emitting diode (LED) has been used as a light source for lighting devices and as a light source for various electronic products. A LED has been widely used as a light source for various display apparatuses such as a TV, a mobile phone, a PC, a laptop PC, and a PDA.

SUMMARY

Embodiments are directed to a display apparatus, including a circuit substrate including driver circuits and first bonding electrodes, and a pixel array on the circuit substrate and including a plurality of pixels each including first to third sub-pixels, and second bonding electrodes bonded to the first bonding electrodes, the pixel array further including, a plurality of first LED cells corresponding to the first and third sub-pixels, respectively, and each including a first conductivity-type semiconductor layer, a first active layer, and a second conductivity-type semiconductor layer, a plurality of second LED cells corresponding to the second sub-pixels, respectively, and each including the first conductivity-type semiconductor layer, a second active layer, and the second conductivity-type semiconductor layer, a first electrode extending to cover upper surfaces of the plurality of first and second LED cells and connected to the first conductivity-type semiconductor layers in common, a plurality of second electrodes on lower surfaces of the plurality of first and second LED cells, respectively, and connected to the second conductivity-type semiconductor layers, respectively, and wavelength converters on the first LED cells in the third sub-pixels, wherein a lower surface of the first electrode is on a first level on the plurality of first LED cells and is on a second level lower than the first level on the plurality of second LED cells.

Embodiments are directed to a display apparatus, including a circuit substrate including driver circuits, and a pixel array on the circuit substrate and including a plurality of pixels, the pixel array further including, a plurality of LED cells included in the plurality of pixels, a first electrode covering upper surfaces of the plurality of LED cells, extending horizontally to a region between the plurality of LED cells, and connected to the plurality of LED cells in common, and a plurality of second electrodes on lower surfaces of the plurality of LED cells, respectively, and connected to the plurality of LED cells, respectively, wherein upper surfaces of a portion of the plurality of LED cells are on a first level, and upper surfaces of the other portion of the plurality of LED cells are on a second level lower than the first level.

Embodiments are directed to a display apparatus, including a circuit substrate including driver circuits, and a pixel array on the circuit substrate and including a plurality of pixels each including first to third sub-pixels, the pixel array further including, a plurality of LED cells corresponding to the first and third sub-pixels, respectively, a first electrode extending to cover upper surfaces of the plurality of LED cells and connected to the plurality of LED cells in common, and a plurality of second electrodes on lower surfaces of the plurality of LED cells, respectively, and connected to the plurality of LED cells, respectively, wherein, a lower surface of the first electrode is on a first level on a portion of the plurality of LED cells, and is on a second level lower than the first level on a portion of the plurality of LED cells, and lower surfaces of the plurality of second electrodes are on the same level.

BRIEF DESCRIPTION OF DRAWINGS

Features will become apparent to those of skill in the art by describing in detail exemplary embodiments with reference to the attached drawings in which.

DETAILED DESCRIPTION

Hereinafter, embodiments of the present disclosure will be described as follows with reference to the accompanying drawings.

Figure 1:
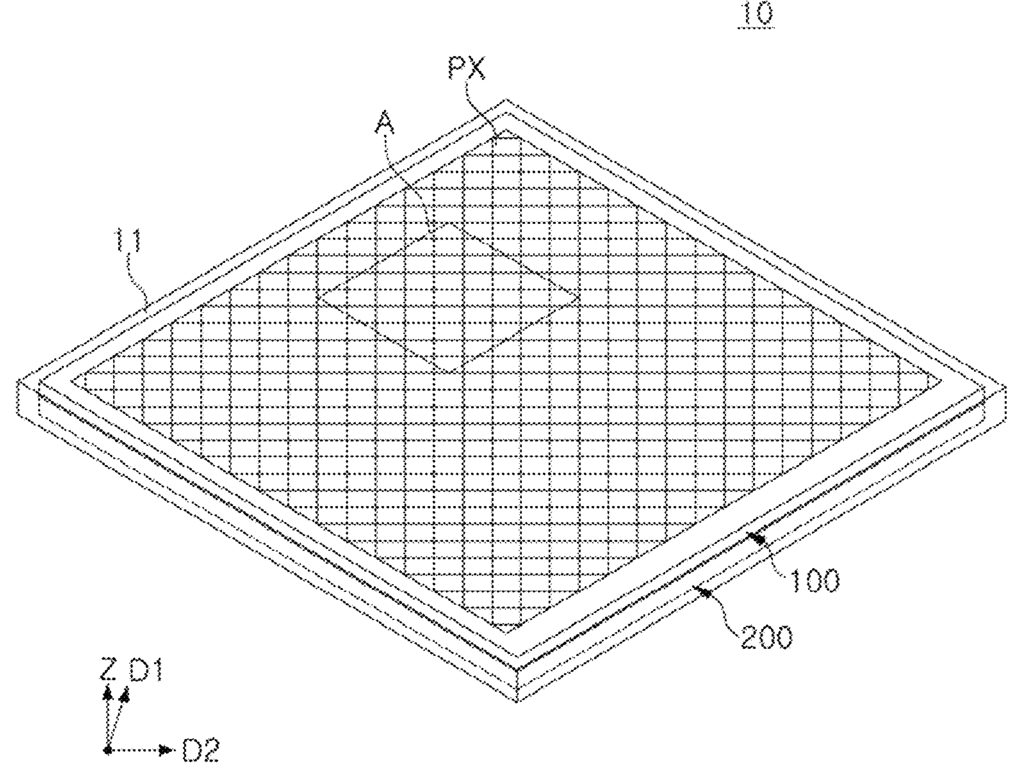
FIG. 1 is a perspective view showing an example embodiment of a display apparatus.
Figure 2:
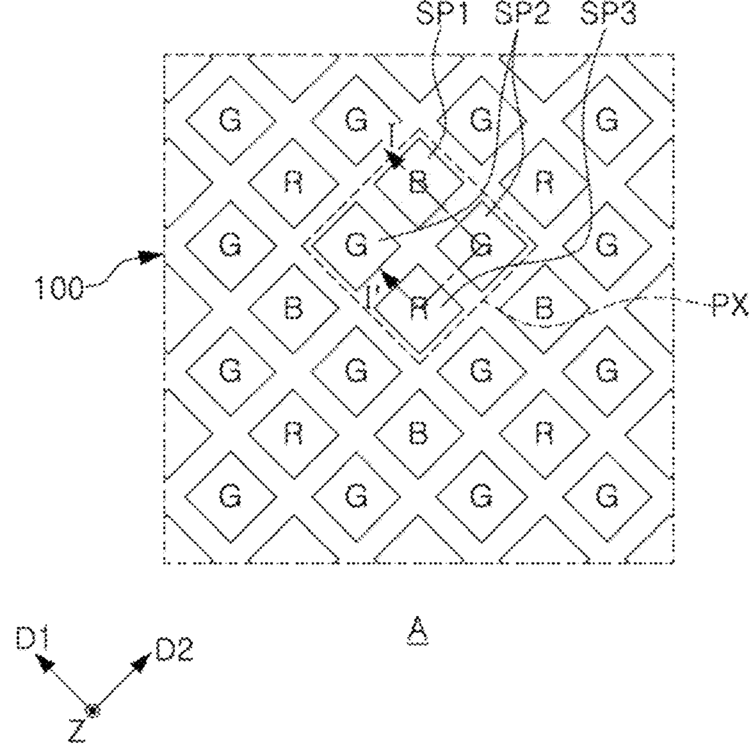
FIG. 2 is a plan diagram showing a portion “A” of the display apparatus of FIG. 1.

FIG. 1 is a perspective view showing an example embodiment of a display apparatus. FIG. 2 is a plan diagram showing a portion “A” of the display apparatus of FIG. 1. Referring to FIGS. 1 and 2, a display apparatus 10 may include a circuit substrate 200 including driver circuits and a pixel array 100 on the circuit substrate 200 and including a plurality of pixels PX arranged therein. The display apparatus 10 may further include a frame 11 surrounding the circuit substrate 200 and the pixel array 100.

The circuit substrate 200 may be configured as a driver circuit substrate including thin film transistor (TFT) cells. In some example embodiments, the circuit substrate 200 may include only a portion of driver circuits for a display apparatus, and in this case, the display apparatus 10 may further include a driving device including the other portion of the driver circuits. In some example embodiments, the circuit substrate 200 may include a flexible substrate, thereby implementing a display apparatus having a curved profile.

The pixel array 100 may be implemented as an LED module for display. The pixel array 100 may include a plurality of pixels PX. Each of the plurality of pixels PX may include first to third sub-pixels SP1, SP2, and SP3 configured to emit light of different specific wavelengths, e.g., first to third sub-pixels SP1, SP2, and SP3 configured to emit light of a specific color. In an implementation, the first to third sub-pixels SP1, SP2, and SP3 may be configured to emit blue (B) light, green (G) light, and red (R) light, respectively. In each pixel PX, the first to third sub-pixels SP1, SP2, and SP3 may be arranged in a diamond pentile structure.

In an implementation, each pixel PX may include first and second sub-pixels SP1 and SP2 in a first column and second and third sub-pixels SP2 and SP3 in a second column, arranged in a first diagonal direction, e.g., the D1 direction. In an implementation, the first column may include two sub-pixels configured to emit blue light and green light respectively. The second column may be arranged in a second diagonal direction perpendicular to the D1 direction, e.g., in the D2 direction. In an implementation, the second column may include two sub-pixels configured to emit green light and red light respectively.

In each pixel PX, the first to third sub-pixels SP1, SP2, and SP3 may be arranged in a diamond shape, e.g., in an order of the first sub-pixel SP1, the second sub-pixel SP2, the third sub-pixel SP3, the second sub-pixel SP2 in a clockwise direction. The pixels PX may be arranged consecutively in the D1 and D2 directions. In FIG. 2, in each pixel PX, four first to third sub-pixels SP1, SP2, and SP3 may be arranged. In an implementation, the four sub-pixels may include one sub-pixel configured to emit blue light, two sub-pixels configured to emit green light, and one sub-pixel configured to emit red light. The length of each pixel PX may be less than or equal to 5 μm, e.g., in the range of about 2.5 μm to about 5 μm, in the D1 and D2 directions, and a length of each of the first to third sub-pixels SP1, SP2, and SP3 may be less than or equal to 2 μm, such as in the range of about 0.7 μm to about 1.3 μm.

In some example embodiments, the first to third sub-pixels SP1, SP2, and SP3 may be arranged in a Bayer pattern. In some example embodiments, a portion of the sub-pixels may be configured to emit light of a color other than the example colors (R, G, and B), e.g., yellow light. In the pixel array 100 in FIG. 1, the number of the plurality of pixels PX may be 1,024×768.

The frame 11 may be around the pixel array 100 and may be provided as a guide defining a dispositional space of the pixel array 100. The frame 11 may include, e.g., polymer, ceramic, semiconductor, or metal. In an implementation, the frame 11 may include a black matrix region. However, the frame 11 may include a white matrix region or a structure of a different color depending on the purpose of the display apparatus 10. In an implementation, the white matrix region may include a reflective material or a scattering material. In FIG. 1, the display apparatus 10 may have a rectangular planar structure. As used herein, the term "or" is not an exclusive term, e.g., "A or B" would include A, B, or A and B.

Figure 3:
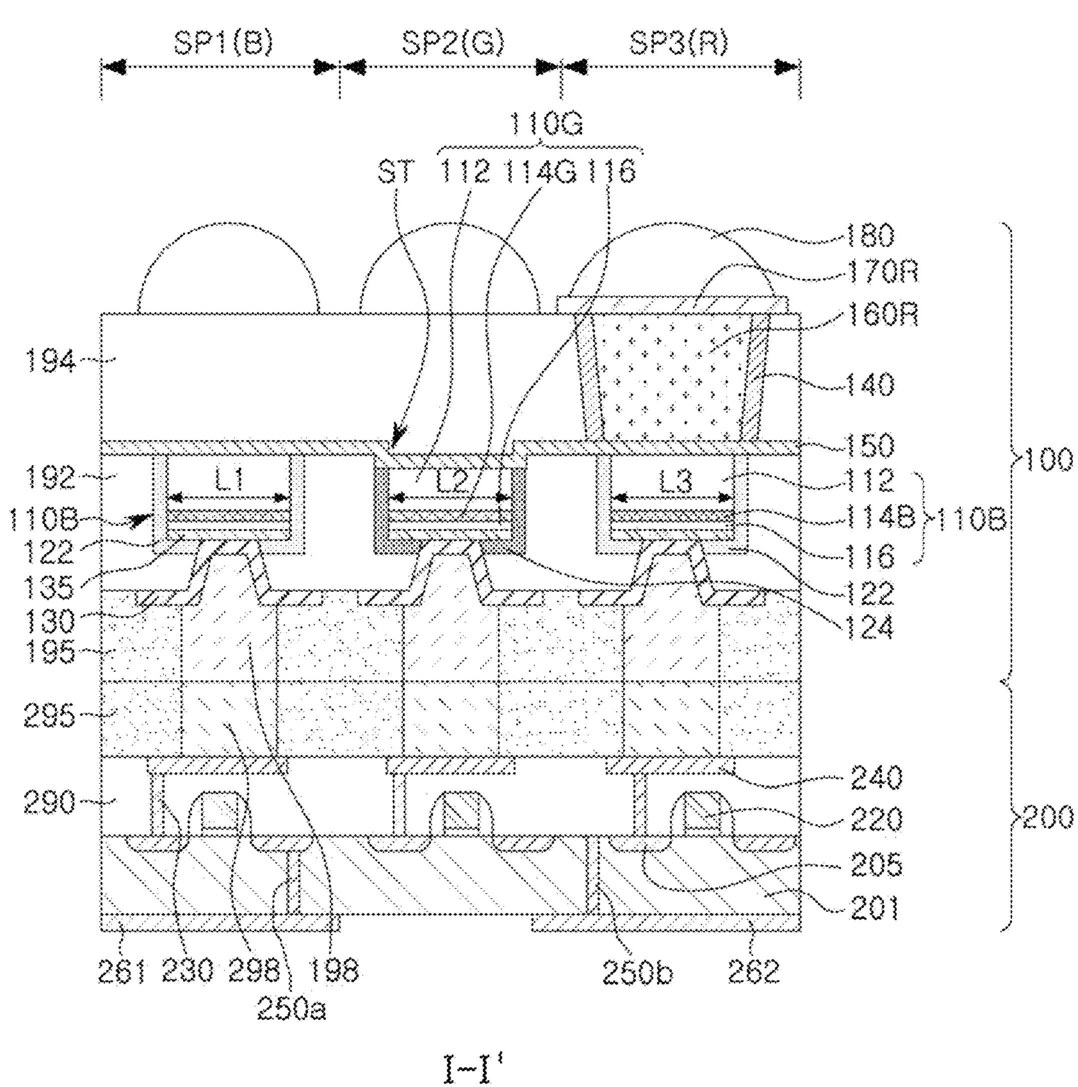
FIG. 3 is a cross-sectional view of the display apparatus shown in FIG. 2 taken along a direction I-I'.

FIG. 3 is a cross-sectional view of the display apparatus shown in FIG. 2 taken along a direction I-I'. Referring to FIG. 3 a display apparatus 10 may include a circuit substrate 200 and a pixel array 100 on the circuit substrate 200.

The circuit substrate 200 may include a semiconductor substrate 201, a driver circuit on the semiconductor substrate 201 and including driving elements 220 including TFT cells, contact plugs 230 electrically connected to the driving elements 220, circuit interconnection lines 240 on the contact plugs 230, and a circuit insulating layer 290 covering the driver circuit. The circuit substrate 200 may include first and second through-electrodes 250*a*, 250*b*, such as a through silicon via (TSV) connected to the driver circuit, and first and second substrate interconnection lines 261 and 262 connected to the first and second through-electrodes 250*a*, 250*b*. The circuit substrate 200 may include a first bonding insulating layer 295 on the circuit insulating layer 290, and first bonding electrodes 298 in the first bonding insulating layer 295 and connected to the circuit interconnection lines 240.

The semiconductor substrate 201 may include impurity regions including source/drain regions 205. The semiconductor substrate 201 may include, e.g., a semiconductor such as silicon (Si) or germanium (Ge), or a compound semiconductor such as SiGe, SiC, GaAs, InAs, or InP.

The driver circuit may include a circuit for controlling driving of a pixel, particularly a sub-pixel. The source/drain regions 205 of the TFT cells may be electrically connected to second bonding electrodes 198 on one side of the LED cells 110B and 110G through the contact plugs 230, the circuit interconnection lines 240, and the first bonding electrodes 298. In an implementation, the source/drain regions 205 of the TFT cells may be connected to the first substrate interconnection line 261 through a first through-electrode 250*a*, and the first substrate interconnection line 261 may be connected to a data line. The gate electrodes of the TFT cells may be connected to the second substrate interconnection line 262 through a second through-electrode 250*b*, and the second substrate interconnection line 262 may be connected to a gate line. This circuit configuration and operation will be described in greater detail with reference to FIG. 4 below.

Upper surfaces of the first bonding electrodes 298 and upper surfaces of the first bonding insulating layer 295 may form an upper surface of the circuit substrate 200. The first bonding electrodes 298 may be bonded to the second bonding electrodes 198 of the pixel array 100 and may provide an electrical connection path. The first bonding electrodes 298 may include a conductive material, e.g., copper (Cu). The first bonding insulating layer 295 may be bonded to the second bonding insulating layer 195 of the pixel array 100. The first bonding insulating layer 295 may include, e.g., SiO, SiN, SiCN, SiOC, SiON, or SiOCN.

The pixel array 100 may include first and second LED cells 110B and 110G, first passivation layers 122 covering side surfaces of the first LED cells 110B, second passivation layers 124 covering side surfaces of the second LED cells 110G, first electrode 150 and second electrodes 130 connected to the first and second LED cells 110B and 110G, a wavelength converter 160R on a portion of first LED cells 110B, a color filter 170R on the wavelength converter 160R, and microlenses 180 on a transparent insulating layer 194 and the color filter 170R. The pixel array 100 may further include contact layers 135 on lower surfaces of first and second LED cells 110B and 110G, a reflective layer 140 surrounding a side surface of the wavelength converter 160R, an interlayer insulating layer 192 between the first and second LED cells 110B and 110G, and the transparent insulating layer 194 on a level corresponding to a level of the wavelength converter 160R, above a level of a second bonding insulating layer 195, and second bonding electrodes 198.

The first and second LED cells 110B and 110G may be included in the first to third sub-pixels SP1, SP2, and SP3, and each may constitute a micro LED, respectively. The first and second LED cells 110B and 110G may be arranged in columns and rows. The first LED cells 110B may be in a region corresponding to the first and third sub-pixels SP1 and SP3, and the second LED cell 110G may be in a region corresponding to the second sub-pixel SP2. The first LED cells 110B may generate blue light, e.g., light having a wavelength ranging from about 440 nm to about 480 nm. The second LED cell 110G may generate green light, e.g., light having a wavelength ranging from about 510 nm to about 550 nm. The first LED cells 110B included in the third sub-pixels SP3 may generate blue light which may then be converted to red light by wavelength converter 160R, as discussed in detail below.

The first LED cells 110B may include a first conductivity-type semiconductor layer 112, a first active layer 114B, and a second conductivity-type semiconductor layer 116 stacked in order from an upper portion to a lower portion of the first LED cells 110B. The first conductivity-type semiconductor layer 112 may be above the first active layer 114B, which may be above the second conductivity-type semiconductor layer 116. The second LED cell 110G may include the first conductivity-type semiconductor layer 112, a second active layer 114G, and the second conductivity-type semiconductor layer 116 stacked in order from an upper portion. The first conductivity-type semiconductor layer 112 may be above the second active layer 114G, which may be above the second conductivity-type semiconductor layer 116.

The first conductivity-type semiconductor layer 112, the first and second active layers 114B, 114G, and the second conductivity-type semiconductor layer 116 may be a nitride semiconductor and may be an epitaxial layer. The first conductivity-type semiconductor layer 112 and the second conductivity-type semiconductor layer 116 may be nitride semiconductor layers having a composition of n-type and p-type $In_xAl_yGa_{1-x-y}N$ ($0 \le x < 1$, $0 \le y < 1$, $0 \le x+y < 1$). In an implementation, the first conductivity-type semiconductor layer 112 may be an n-type gallium nitride (n-GaN) layer doped with silicon (Si), germanium (Ge), or carbon (C), and the second conductivity-type semiconductor layer 116 may be a p-type gallium nitride (p-GaN) layer doped with magnesium (Mg) or zinc (Zn). However, in example embodiments, the first conductivity-type semiconductor layer 112 and the second conductivity-type semiconductor layer 116 may be configured as a semiconductor layer based on aluminum indium gallium phosphide (AlInGaP) or aluminum indium gallium arsenide (AlInGaAs) other than a nitride semiconductor. The first conductivity-type semiconductor layer 112 and the second conductivity-type semiconductor layer 116 may be a single layer or may include a plurality of layers having different characteristics such as different doping concentrations and different compositions.

The first and second active layers 114B and 114G may emit light having a predetermined energy by recombination of electrons and holes. The first and second active layers 114B and 114G may have different compositions to emit light of different wavelengths. The first and second active layers 114B and 114G may have a single quantum well (SQW) structure or a multiple quantum well (MQW) structure in which quantum barrier layers and quantum well layers may be alternately disposed. In an implementation, the quantum well layer and the quantum barrier layer may be $In_xAl_yGa_{1-x-y}N$ ($0 \le x \le 1$, $0 \le y \le 1$, $0 \le x+y \le 1$) having different compositions. In an implementation, the quantum well layer may be an InxGa1-xN ($0 < x \le 1$) layer, and the quantum barrier layer may be a gallium nitride (GaN) layer or an aluminum gallium nitride (AlGaN) layer.

In each of the first and second LED cells 110B and 110G, an angle between a lower surface and side surfaces may be a right angle or an angle similar to a right angle. In an implementation, the angle may be in the range of about 85 degrees to about 95 degrees. The first and second LED cells 110B and 110G may have such a structure by performing a dry etching process and a wet etching process in order, as described below with reference to FIGS. 8A and 8B.

The second LED cell 110G may be configured as an LED cell transferred through a fluidic transfer process on the base semiconductor layer 111 (see FIG. 8C) on which the first LED cells 110B may be grown. Due to the above process, upper surfaces of the first and second LED cells 110B and 110G may have different levels. This process will be described in greater detail with reference to FIG. 8C below. The level of the upper surface of the second LED cells 110G may be lower than the level of the upper surface of the first LED cells 110B. The first and second active layers 114B and 114G may be on substantially the same level. In an implementation, the first and second LED cells 110B and 110G may have different thicknesses, and the thickness of the second LED cells 110G may be smaller than the thickness of the first LED cells 110B. In other words, the second LED cells 110G may be smaller in a vertical direction than the first LED cells 110B.

The first LED cells 110B may have substantially the same widths L1 and L3 or horizontal lengths in first and third sub-pixels SP1 and SP3. In the example embodiment, the widths L1 and L3 of the first LED cells 110B may be substantially equal to the width L2 of the second LED cell 110G.

The first and second passivation layers 122 and 124 may cover a portion of lower surfaces of the contact layers 135 and side surfaces of first and second LED cells 110B and 110G, respectively. The first and second passivation layers 122 and 124 may be in contact with the first electrode 150 through the upper surfaces. The first and second passivation layers 122 and 124 may have a substantially uniform thickness and may extend conformally.

The first and second passivation layers 122 and 124 may include the same material or different materials. The first and second passivation layers 122 and 124 may include a light transmitting or an insulating material. In an implementation, the first and second passivation layers 122 and 124 may include metal oxide or semiconductor oxide. In an implementation, the first and second passivation layers 122 and 124 may include $SiO_2$, SiN, SiCN, SiOC, SiON, SiOCN, $HfO_x$, $AlO_x$, $ZrO_x$, $TiO_x$, or AlN. In example embodiments, at least one of the first and second passivation layers 122 and 124 may have a multilayer structure. In some example embodiments, at least one of the first and second passivation layers 122 and 124 may include a distributed Bragg reflector (DBR) layer.

Upper surfaces or upper ends of the first and second passivation layers 122 and 124 may also have different levels. The level of the upper surfaces of the second passivation layer 124 may be lower than the level of the upper surfaces of the first passivation layers 122.

The first electrode 150 may be connected to the first conductivity-type semiconductor layers 112 of the first and second LED cells 110B and 110G in common, that is, simultaneously. The first electrode 150 may be connected to each other between pixels PX (see FIG. 2) adjacent to each other, may be in a single layer, and may be connected to first and second LED cells 110B and 110G in common. In an implementation, the first electrode 150 may extend horizontally while covering the upper surfaces of the first and second LED cells 110B and 110G. The first electrode 150 may cover the upper surfaces of the first and second passivation layers 122 and 124 and may extend to regions between the first and second LED cells 110B and 110G. The first electrode 150 may include a transparent electrode material such as indium tin oxide (ITO), indium zinc oxide (IZO), or gallium-aluminum doped zinc oxide (GAZO).

In the example embodiment, the first electrode 150 may have a substantially uniform thickness. Accordingly, the first electrode 150 may have step differences ST depending on a level difference between upper surfaces of the first and second LED cells 110B and 110G. In other words, due to the uniform thickness of the first electrode 150, the step differences ST will be equal to the level difference between upper surfaces of the first and second LED cells 110B and 110G. An upper surface of the first electrode 150 may be on a first level in first regions above the first LED cells 110B and the first passivation layers 122 and may be on a second level lower than the first level in second regions above the second LED cell 110G and the second passivation layer 124. An upper surface of the first electrode 150 may be on the first level in third regions between the first and second LED cells 110B and 110G. The lower surface of the first electrode 150 may be on a third level in the first regions above the first LED cells 110B and the first passivation layers 122 and may be on a fourth level lower than the third level in the second regions above the second LED cell 110G and the second passivation layer 124. The lower surface of the first electrode 150 may be on the third level in the third regions between the first and second LED cells 110B and 110G.

The contact layers 135 and the second electrodes 130 may be disposed in order on lower surfaces of the second conductivity-type semiconductor layers 116 and may be connected to the second conductivity-type semiconductor layers 116. Each contact layer 135 may cover the entire lower surface of the second conductivity-type semiconductor layer 116.

The second electrodes 130 may be below the contact layers 135 and may be connected to the contact layers 135. The second electrodes 130 may be connected to the second conductivity-type semiconductor layers 116 through the contact layers 135. The second electrodes 130 may be on substantially the same level as each other, e.g., at least lower surfaces thereof may be on substantially the same level. In some example embodiments, the lower surfaces of the second electrodes 130 may be on substantially the same level, and portions of the upper surfaces of the second electrode 130 may be on a level different from other portions of the upper surfaces of other second electrodes 130 connected to the second LED cell 110G. Here, the lower surfaces of the second electrodes 130 may refer to lowermost surfaces which may be lower surfaces in regions on the lower surface of the interlayer insulating layer 192. The second electrode 130 may overlap at least portions of the first and second LED cells 110B and 110G in a vertical direction below the first and second LED cells 110B and 110G, respectively. The length of the second electrode 130 in one direction may be the same as or similar to the length of the LED cells 110. In some example embodiments, the second electrodes 130 may not be provided, and in this case, the contact layers 135 may be referred to as second electrodes and may be directly connected to the second bonding electrodes 198 below.

The contact layers 135 and second electrodes 130 may include a highly reflective metal, e.g., silver (Ag), nickel (Ni), aluminum (Al), chromium (Cr), rhodium (Rh), iridium (Ir), palladium (Pd), ruthenium (Ru), magnesium (Mg), zinc (Zn), Platinum (Pt), gold (Au), titanium (Ti), titanium nitride (TiN), tantalum (Ta), tantalum nitride (TaN), tungsten (W), indium tin oxide (ITO), or indium zinc oxide (IZO).

The interlayer insulating layer 192 may fill the third region between the first and second LED cells 110B and 110G and cover lower surfaces of the first and second passivation layers 122 and 124. A transparent insulating layer 194 may be on the first electrode 150 on a level corresponding to a level of the wavelength converter 160R. The transparent insulating layer 194 may not include a wavelength conversion material. The interlayer insulating layer 192 and transparent insulating layer 194 may be configured as a transparent layer and may include an insulating material such as a transparent resin.

A wavelength converter 160R may be on the first LED cell 110B in the third sub-pixel SP3. A wavelength converter may not be in the first and second sub-pixels SP1 and SP2, and only the transparent insulating layer 194 may be disposed beneath the microlens 180 in these sub-pixels. The wavelength converter 160R may be a wavelength conversion material such as quantum dots dispersed in a liquid binder resin, filled in an opening of the transparent insulating layer 194 and cured therein. A wavelength converter 160R may include quantum dots for converting wavelengths of blue light to red light. The wavelength converter 160R may have a sloped side surface such that a first width of an upper portion of the wavelength converter 160R is greater than a second width of a lower portion of the wavelength converter 160R.

The reflective layer 140 may surround a side surface of the wavelength converter 160R in the transparent insulating layer 194. The reflective layer 140 may include a reflective metal, e.g., silver (Ag), nickel (Ni), or aluminum (Al). In some example embodiments, the reflective layer 140 may have a multilayer structure. In some example embodiments, the reflective layer 140 may include an omnidirectional reflective (ODR) layer.

The color filter 170R may be on the wavelength converter 160R in the third sub-pixel SP3. The color filter 170R may increase color purity of light emitted through the wavelength converter 160R. In some example embodiments, a color filter may be further disposed on the first sub-pixel SP1 or the second sub-pixel SP2.

The microlenses 180 may be on the transparent insulating layer 194 to correspond to the first and second LED cells 110B and 110G, respectively. The microlenses 180 may collect light incident from the first and second LED cells 110B and 110G and the wavelength converter 160R. The microlenses 180 may have a diameter larger than a width of the first and second LED cells 110B and 110G in one direction. The microlenses 180 may include, e.g., a transparent photoresist material or a transparent thermoset resin.

The second bonding electrodes 198 may connect the second electrodes 130 to the first bonding electrodes 298 of the circuit substrate 200. The second bonding electrodes 198 may penetrate through the interlayer insulating layer 192 and the second bonding insulating layer 195. The second bonding electrodes 198 may have a columnar shape such as a cylinder. In example embodiments, the second bonding electrodes 198 may have an inclined sidewall such that an upper surface size may be smaller than a lower surface size. That is, a width of the second bonding electrodes 198 may be smaller at an upper portion than at a lower portion. The second bonding electrodes 198 may include, e.g., copper (Cu). In some example embodiments, the second bonding electrodes 198 may further include a barrier metal layer, e.g., a tantalum (Ta) layer or a tantalum nitride (TaN) layer, on upper and side surfaces.

Lower surfaces of the second bonding insulating layer 195 may form a lower surface of the pixel array 100 together with lower surfaces of the second bonding electrodes 198. The second bonding insulating layer 195 may form dielectric-to-dielectric bonding with the first bonding insulating layer 295. The circuit substrate 200 and pixel array 100 may be bonded to each other by bonding between the first bonding electrodes 298 and the second bonding electrodes 198 and bonding between the first bonding insulating layer 295 and the second bonding insulating layer 195. The bonding between the first bonding electrodes 298 and the second bonding electrodes 198 may be, e.g., copper (Cu)-to-copper (Cu) bonding, and bonding between the first bonding insulating layer 295 and the second bonding insulating layer 195 may be dielectric-dielectric bonding, such as SiCN-to-SiCN bonding. The circuit substrate 200 and the pixel array 100 may be bonded to each other by hybrid bonding including copper (Cu)-to-copper (Cu) bonding and dielectric-to-dielectric bonding, and may be bonded without an adhesive layer.

The display apparatus 10 according to the example embodiment may include the second LED cell 110G transferred through a fluidic transfer process. By optimizing the arrangement of the first electrode 150 and the second electrodes 130 and bonding the circuit substrate 200 to the pixel array 100 using hybrid bonding, an apparatus having high resolution, a reduced size, and an easy manufacturing process may be implemented.

Figure 4:
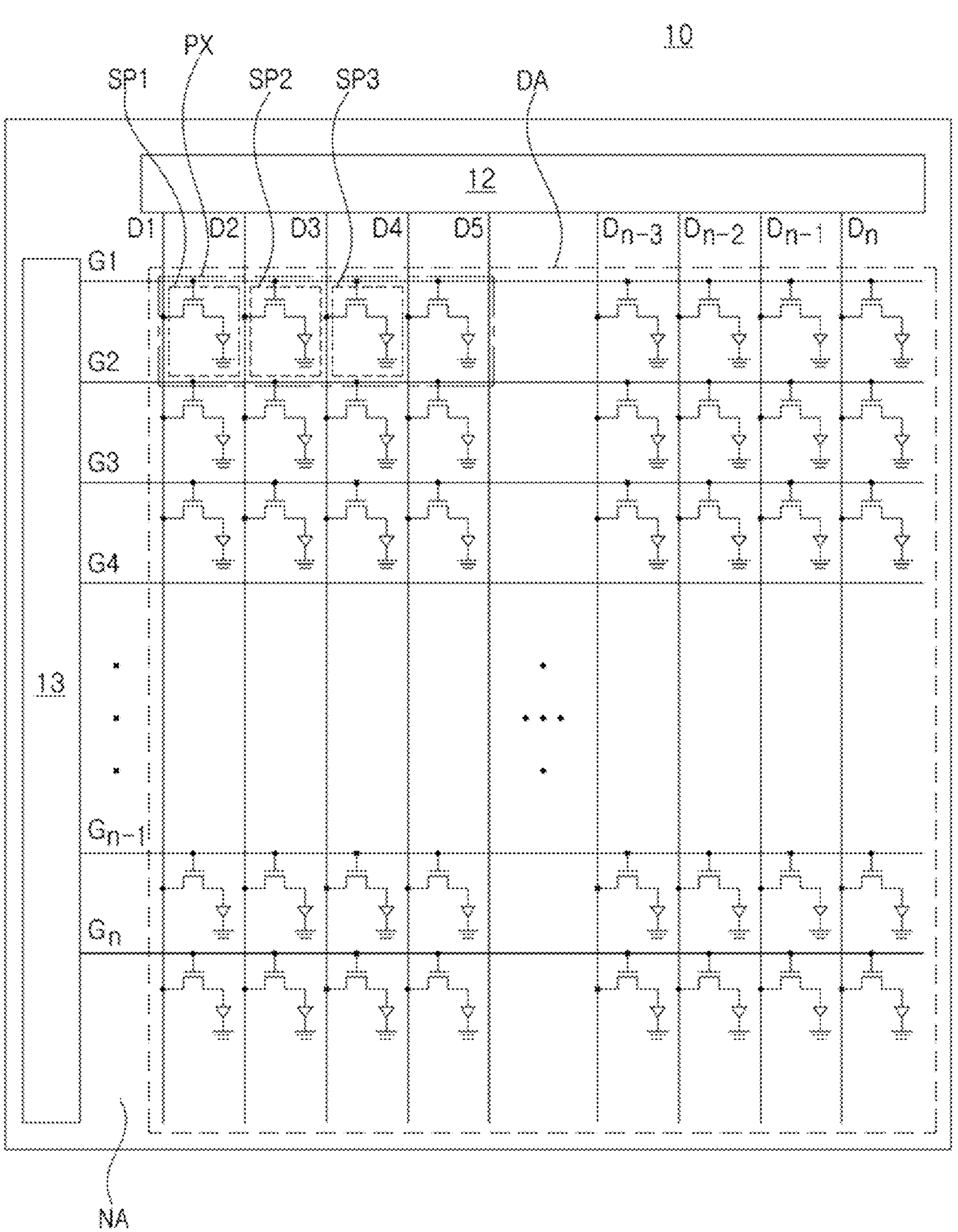
FIG. 4 is a circuit diagram showing an example embodiment of a driving circuit implemented in a display apparatus.

FIG. 4 is a circuit diagram showing an example embodiment of a driving circuit implemented in a display apparatus. FIG. 4 shows a circuit diagram of a display apparatus 10 in which n×n sub-pixels may be arranged. The first to third sub-pixels SP1, SP2, and SP3 may transmit and receive data signals through data lines D1-Dn which may be paths in a vertical direction, e.g., a column direction. The first to third sub-pixels SP1, SP2, and SP3 may transmit and receive control signals, that is, gate signals, through gate lines G1-Gn which may be paths in a horizontal direction, e.g., a row direction.

The plurality of pixels PX including the first to third sub-pixels SP1, SP2, and SP3 may provide an active region DA for display, and the active region DA may be provided as a display region for a user. The inactive region NA may be along one or more edges of the active region DA. The inactive region NA may extend along an outer circumference of a panel of display apparatus 10, and the pixels PX may not be present therein. The inactive region NA may correspond to the frame 11 of the display apparatus 10.

The first and second driver circuits 12 and 13 may be employed to control operation of pixels PX, that is, the first to third sub-pixels SP1, SP2 and SP3. A portion of or the entirety of the first and second driver circuits 12 and 13 may be implemented on the circuit substrate 200. The first and second driver circuits 12 and 13 may be integrated circuits, thin film transistor panel circuits, or other suitable circuits, and may be located in the inactive region NA of the display apparatus 10. The first and second driver circuits 12 and 13 may include a microprocessor, a memory such as storage, a processing circuitry, and a communication circuitry.

To display an image by the pixels PX, the first driver circuit 12 may transmit a clock signal and other control signals to the second driver circuit 13, which may be a gate driver circuit, while supplying image data to the data lines D1-Dn. The second driver circuit 13 may be implemented using an integrated circuit or a thin film transistor circuit. A gate signal for controlling the first to third sub-pixels SP1, SP2, and SP3 arranged in a row direction may be transmitted through the gate lines G1-Gn of the display apparatus 10.

Figure 5:
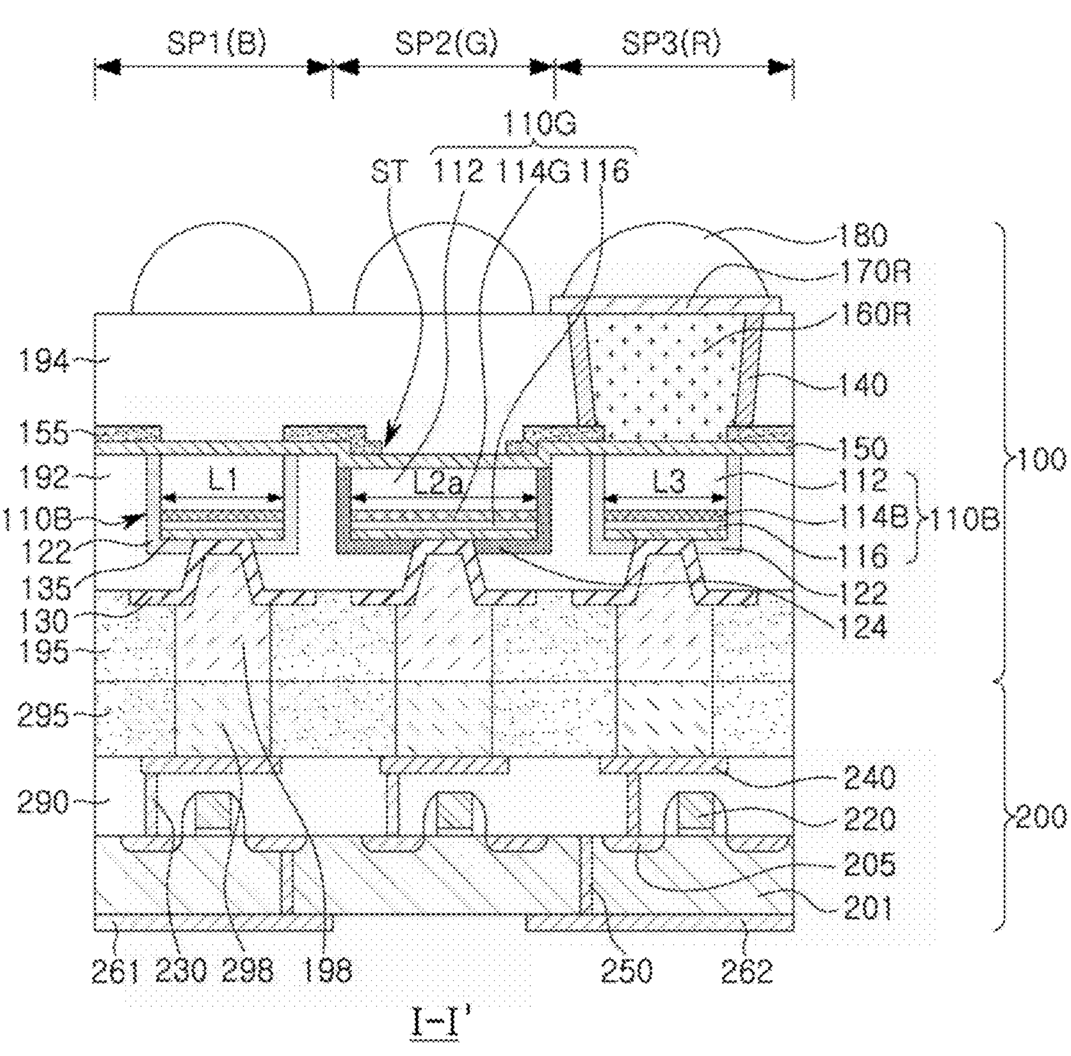
FIGS. 5 to 7 are cross-sectional views showing example embodiments of the display apparatus shown in FIG. 2 taken along a direction I-I'.
Figure 6:
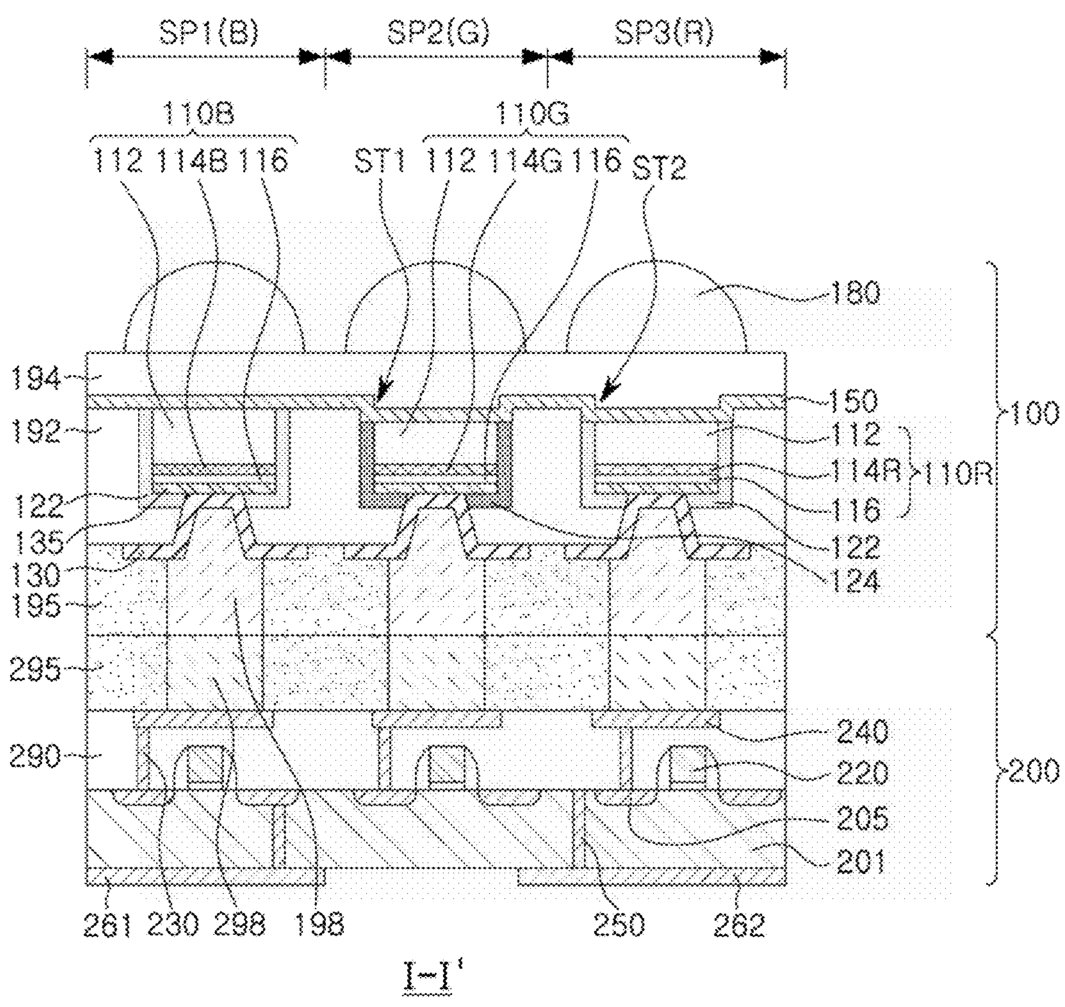
Figure 7:
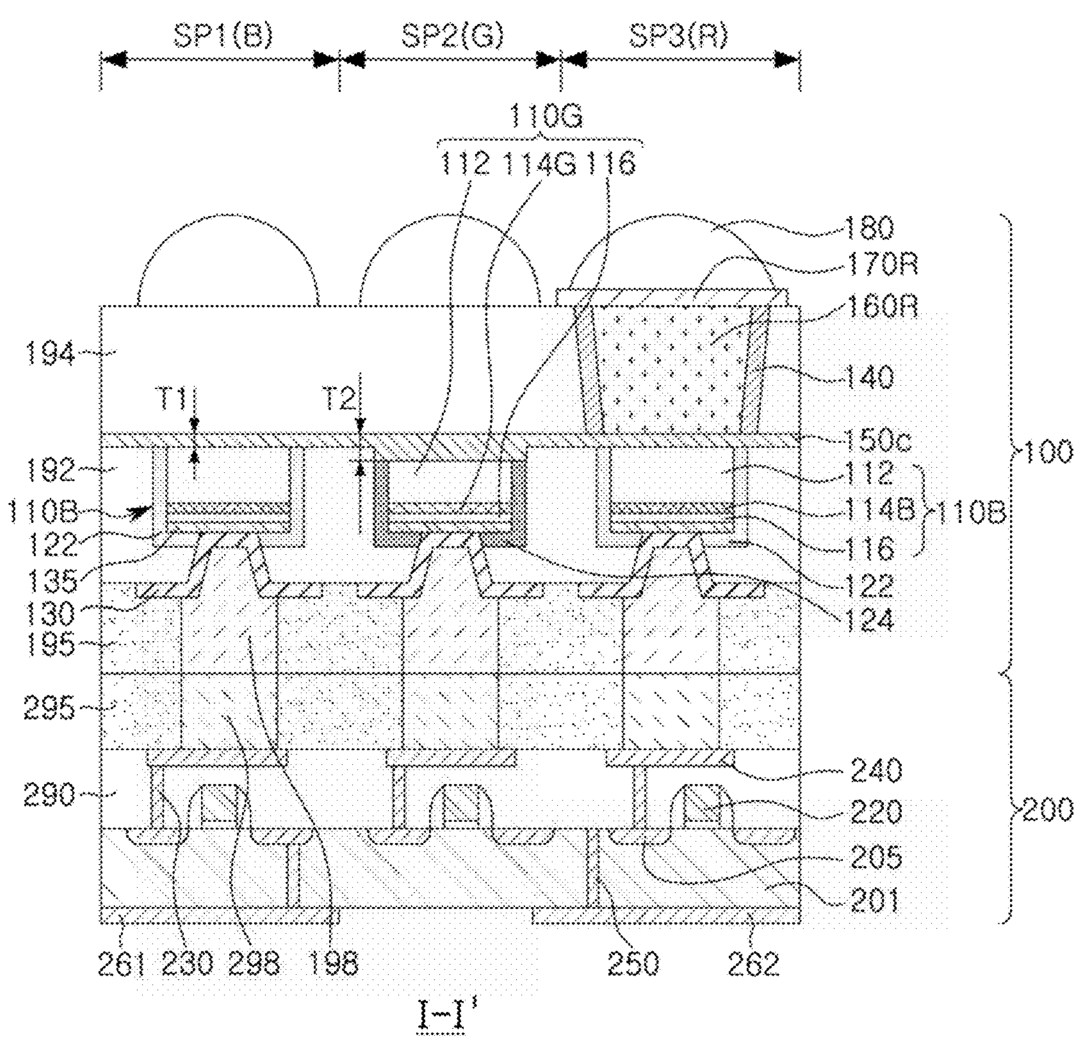

FIGS. 5 to 7 are cross-sectional views showing example embodiments of the display apparatus shown in FIG. 2 taken along a direction I-I'. Referring to FIG. 5, in display apparatus 10*a*, the first LED cells 110B and the second LED cells 110G may have different widths or horizontal lengths. Also, the pixel array 100 may further include a light blocking layer 155.

The first LED cells 110B may have substantially the same widths L1 and L3 or the same horizontal lengths in the first and third sub-pixels SP1 and SP3. In the example embodiment, the widths L1 and L3 of the first LED cells 110B may be smaller than a width L2*a* of the second LED cell 110G. The second LED cell 110G may be grown to a relatively large width for an easy transfer process. In an implementation, the width L2*a* of the second LED cell 110G may be larger than the widths L1 and L3 of the first and third sub-pixels SP1 and SP3. In this case, a light blocking layer 155 may be on the first electrode 150 to configure light emitting areas of the first and second LED cells 110B and 110G to be the same. In other words, as shown in FIG. 5., a light blocking layer 155 may block an upper portion of second LED cell 110G such that two light emitting layers (e.g., first LED cell 110B and second LED cell 110G) emit a same amount of light.

The light blocking layer 155 may be in regions including interfacial surfaces of the first to third sub-pixels SP1, SP2, and SP3, and may be on regions between the first and second LED cells 110B and 110G. In an implementation, the light blocking layer 155 may be on the first electrode 150 in regions including regions between the first and second LED cells 110B and 110G. The light blocking layer 155 may have a mesh shape when viewed in a plan view. The regions exposed from the light blocking layer 155 may have the same width in one direction. In example embodiments, the range of regions exposed from the light blocking layer 155 may be varied in a range satisfying optical characteristics of the display apparatus 10*a*. The light blocking layer 155 may include a black matrix or may include a metal material such as tungsten (W), copper (Cu), or aluminum (Al).

In example embodiments, even when the first and second LED cells 110B and 110G have the same width, a light blocking layer 155 may be further disposed in consideration of the example in which the second LED cell 110G is not precisely aligned between the first LED cells 110B. The light blocking layer 155 in the example embodiment may also be applied to the example embodiments in FIGS. 3, 6, and 7.

Referring to FIG. 6, in the display apparatus 10*b*, the pixel array 100 may include the first to third LED cells 110B, 110G, and 110R, and may not include the wavelength converter 160R and the color filter 170R in FIG. 3. The third LED cell 110R may be in the third sub-pixel SP3. The third LED cell 110R may generate red light, e.g., light having a wavelength ranging from about 610 nm to about 650 nm. The third LED cell 110R may include a first conductivity-type semiconductor layer 112, a third active layer 114R, and a second conductivity-type semiconductor layer 116 stacked in order from an upper portion. The first conductivity-type semiconductor layer 112 may be above the third active layer 114R, which may be above the second conductivity-type semiconductor layer 116. The first to third active layers 114B, 114G, and 114R may have different compositions to emit light of different wavelengths.

Similarly to the second LED cell 110G, the third LED cell 110R may be an LED cell transferred through a fluidic transfer process on the base semiconductor layer on which the first LED cell 110B is grown. Accordingly, a level of the upper surface of the third LED cell 110R may be lower than a level of the upper surface of the first LED cell 110B. A level of the upper surface of the third LED cell 110R may be the same as or similar to a level of the upper surface of the second LED cell 110G. In some example embodiments, a level of an upper surface of the third LED cell 110R may be different from a level of an upper surface of the second LED cell 110G. The first to third active layers 114B, 114G, and 114R may be on substantially the same level.

The first electrode 150 may have first and second step differences ST1 and ST2 depending on a level difference between upper surfaces of the first LED cell 110B and the second and third LED cells 110G and 110R. Depths of the first and second step differences ST1 and ST2 may be the same or different. In some example embodiments, the pixel array 100 may further include a color filter on at least one of the first to third LED cells 110B, 110G, and 110R.

The arrangement of the first to third LED cells 110B, 110G, and 110R in the example embodiment may also be applied to the example embodiments in FIGS. 6 and 7. Referring to FIG. 7, in the display apparatus 10*c*, the first electrode 150*c* may have a flat upper surface. The upper surface of the first electrode 150*c* may be on one level. The lower surface of the first electrode 150*c* may be on a plurality of levels as described above with reference to FIG. 3. Accordingly, the first electrode 150*c* may include regions having different thicknesses. The first electrode 150*c* may have a first thickness T1 on the first LED cells 110B and may have a second thickness T2 greater than the first thickness T1 on the second LED cell 110G. The shape of the first electrode 150*c* in the example embodiment may also be applied to the example embodiments in FIGS. 5, 6, and 7.

Figure 8A:
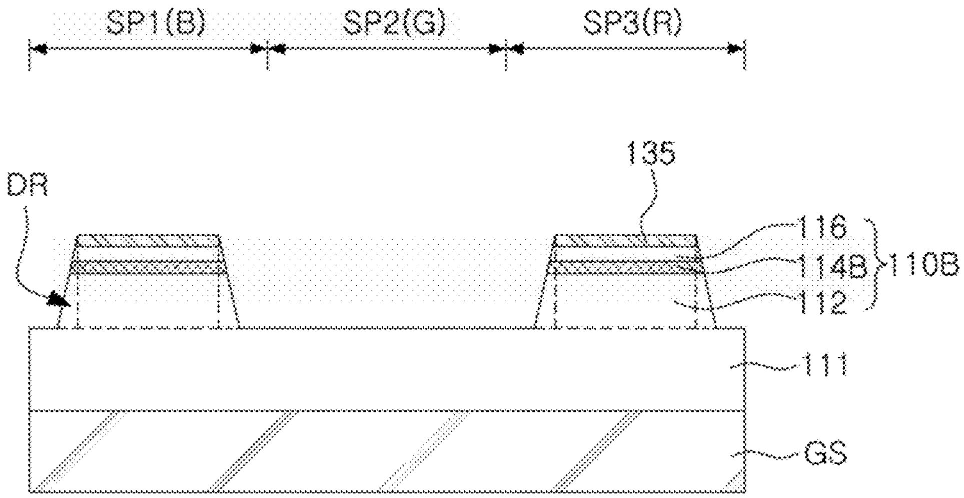
FIGS. 8A to 8M are cross-sectional views showing steps in a method of manufacturing a display apparatus.

FIGS. 8A to 8M are cross-sectional views showing steps in a method of manufacturing a display apparatus. Referring to FIG. 8A, a base semiconductor layer 111, a first conductivity-type semiconductor layer 112, a first active layer 114B, and a second conductivity-type semiconductor layer 116 may be formed in order on the growth substrate GS. A contact layer 135 may be formed on the second conductivity-type semiconductor layer 116, and the stack structure may be etched to form first LED cells 110B.

The growth substrate GS may be configured to grow a nitride single crystal, and may include, e.g., sapphire, Si, SiC, $MgAl_2O_4$, MgO, $LiAlO_2$, $LiGaO_2$, or GaN. In some example embodiments, to improve crystallinity and light extraction efficiency of the semiconductor layers, the growth substrate GS may have an uneven structure on at least a portion of an upper surface thereof. In this case, unevenness may also be on the layers grown thereon.

The base semiconductor layer 111, the first conductivity-type semiconductor layer 112, the first active layer 114B, and the second conductivity-type semiconductor layer 116 may be formed using, e.g., metal organic chemical vapor deposition (MOCVD), hydride vapor phase epitaxy (HVPE) or molecular beam epitaxy (MBE). The base semiconductor layer 11I and the first conductivity-type semiconductor layer 112 may be n-type nitride semiconductor layers such as n-type gallium nitride (GaN), and the second conductivity-type semiconductor layer 116 may be a p-type nitride semiconductor layer such as p-type gallium nitride (GaN) or p-type aluminum gallium nitride (AlGaN). The first active layer 114B may have a multi-quantum well structure such as indium gallium nitride (InGaN) or gallium nitride (GaN). In example embodiments, the base semiconductor layer 111 may include a buffer layer. In this case, the buffer layer may be provided to mitigate lattice defects of the first conductivity-type semiconductor layer 112 and may include undoped nitride semiconductors such as undoped gallium nitride (GaN), undoped aluminum nitride (AlN), or undoped indium gallium nitride (InGaN).

The contact layer 135 may be on the upper surface of the second conductivity-type semiconductor layer 116. In an implementation, the contact layer 135 may be a highly reflective ohmic contact layer.

The stack structure including the base semiconductor layer 111, the first conductivity-type semiconductor layer 112, the first active layer 114B, the second conductivity-type semiconductor layer 116, and the contact layer 135 may be partially removed using a dry etching process. Accordingly, first LED cells 110B may be in the first and third sub-pixels SP1 and SP3. The entirety of the stack structure may be removed from the second sub-pixel SP2. In this process, the first LED cells 110B may be etched to have an inclined side surface. Damaged regions DR may be left on the side surfaces of the first LED cells 110B after the dry etching process.

Figure 8B:
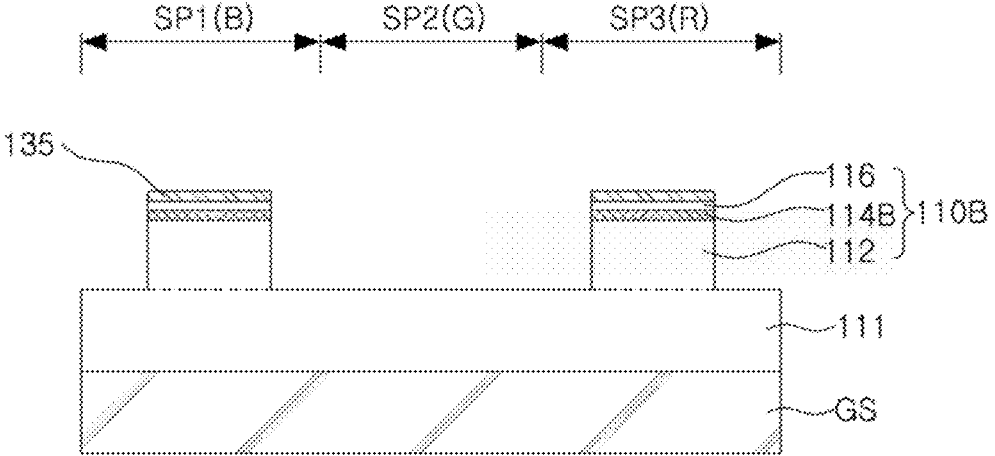

Referring to FIG. 8B, the damaged regions DR may be removed from the first LED cells 110B. The damaged regions DR may be selectively removed by, e.g., a wet etching process. During the wet etching process, only damaged regions DR may be selectively removed by controlling process conditions such that selectivity between crystal planes may be etched differently. Accordingly, in the first LED cells 110B, the angle between the upper surfaces and the side surfaces may be perpendicular or close to perpendicular, and non-radiative recombination may be reduced due to the damaged regions DR such that luminance may be improved. In some example embodiments, this process may not be performed, and in this case, the first LED cells 110B may have inclined side surfaces.

Figure 8C:
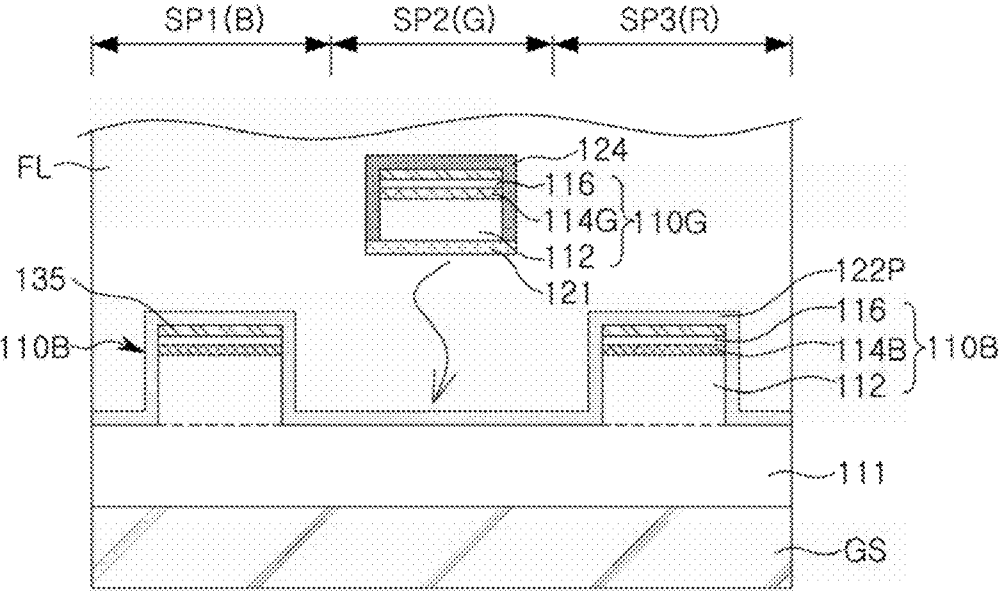

Referring to FIG. 8C, a first preliminary passivation layer 122P may be formed, and a second LED cell 110G may be fluid-transferred to the base semiconductor layer 111. The first preliminary passivation layer 122P may have a uniform thickness on the first LED cells 110B and the base semiconductor layer 111. The first preliminary passivation layer 122P may include, e.g., $SiO_2$, SiN, SiCN, SiOC, SiON, SiOCN, $HfO_2$, $Al_2O_3$, $ZrO_x$, AlN, or $TiO_x$. In example embodiments, the first preliminary passivation layer 122P may include a metal oxide on an uppermost portion, and may include, e.g., a $SiO_2$ layer, a $HfO_2$ layer, and a $Al_2O_3$ layer stacked in order.

The second LED cell 110G may be prepared by being grown on a growth substrate. A second passivation layer 124 may be on a side surface and an upper surface of the second LED cell 110G, and a bonding layer 121 may be on a lower surface. The bonding layer 121 may include, e.g., oxide. The second LED cell 110G may be separated from the growth substrate in a solution such as potassium hydroxide (KOH) or tetramethylammonium hydroxide.

The second LED cell structure including the second LED cell 110G, the second passivation layer 124, and the bonding layer 121 may be transferred to the base semiconductor layer 111 of the second sub-pixel SP2 in the solution FL by a fluidic transfer process. The solution FL may be, e.g., water, or ethanol. The second LED cell structure may be transferred to a space between the first LED cells 110B and may be bonded to the first preliminary passivation layer 122P by the bonding layer 121. In an implementation, the bonding layer 121 and the first preliminary passivation layer 122P may be bonded by dielectric-to-dielectric bonding.

Figure 8D:
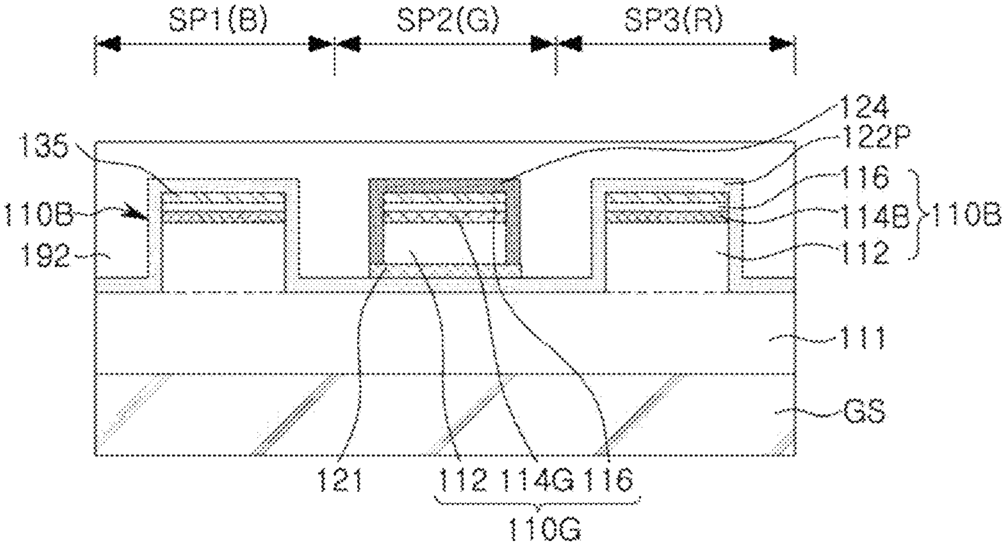

Referring to FIG. 8D, an interlayer insulating layer 192 may be formed. The interlayer insulating layer 192 may fill a region between the first and second LED cells 110B and 110G and may be on the first preliminary passivation layer 122P and the second passivation layer 124.

Figure 8E:
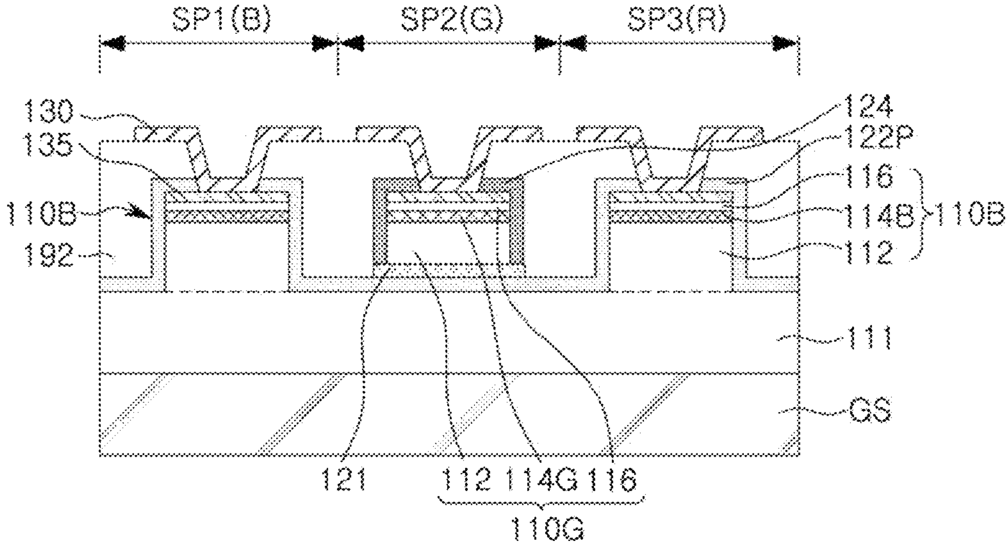

Referring to FIG. 8E, second electrodes 130 connected to contact layers 135 may be formed. Contact holes exposing the contact layers 135 may be formed by partially etching the interlayer insulating layer 192, the first preliminary passivation layer 122P, and the second passivation layer 124 on the first and second LED cells 110B and 110G. The second electrodes 130 may be formed by conformally depositing a conductive material in the contact holes. The second electrodes 130 may cover internal surfaces of the contact holes and may extend to an upper surface of the interlayer insulating layer 192.

Figure 8F:
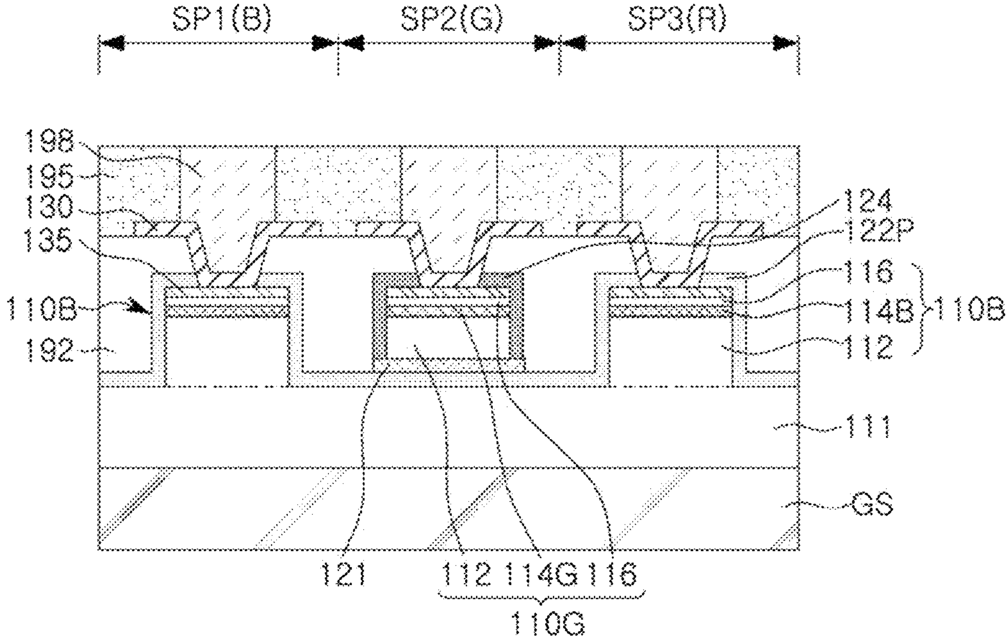

Referring to FIG. 8F, a second bonding insulating layer 195 may be on second electrodes 130, and second bonding electrodes 198 may be formed. The second bonding insulating layer 195 may include the same material as the interlayer insulating layer 192 or a material different from the interlayer insulating layer 192. In example embodiments, a thickness of the second bonding insulating layer 195 may be varied in a range in which the second bonding insulating layer 195 forms one surface of the pixel array 100.

The second bonding electrodes 198 may be formed by forming via holes penetrating through the second bonding insulating layer 195 and the interlayer insulating layer 192 and filling the via holes with a conductive material. The second bonding electrodes 198 may be connected to the second electrodes 130.

Figure 8G:
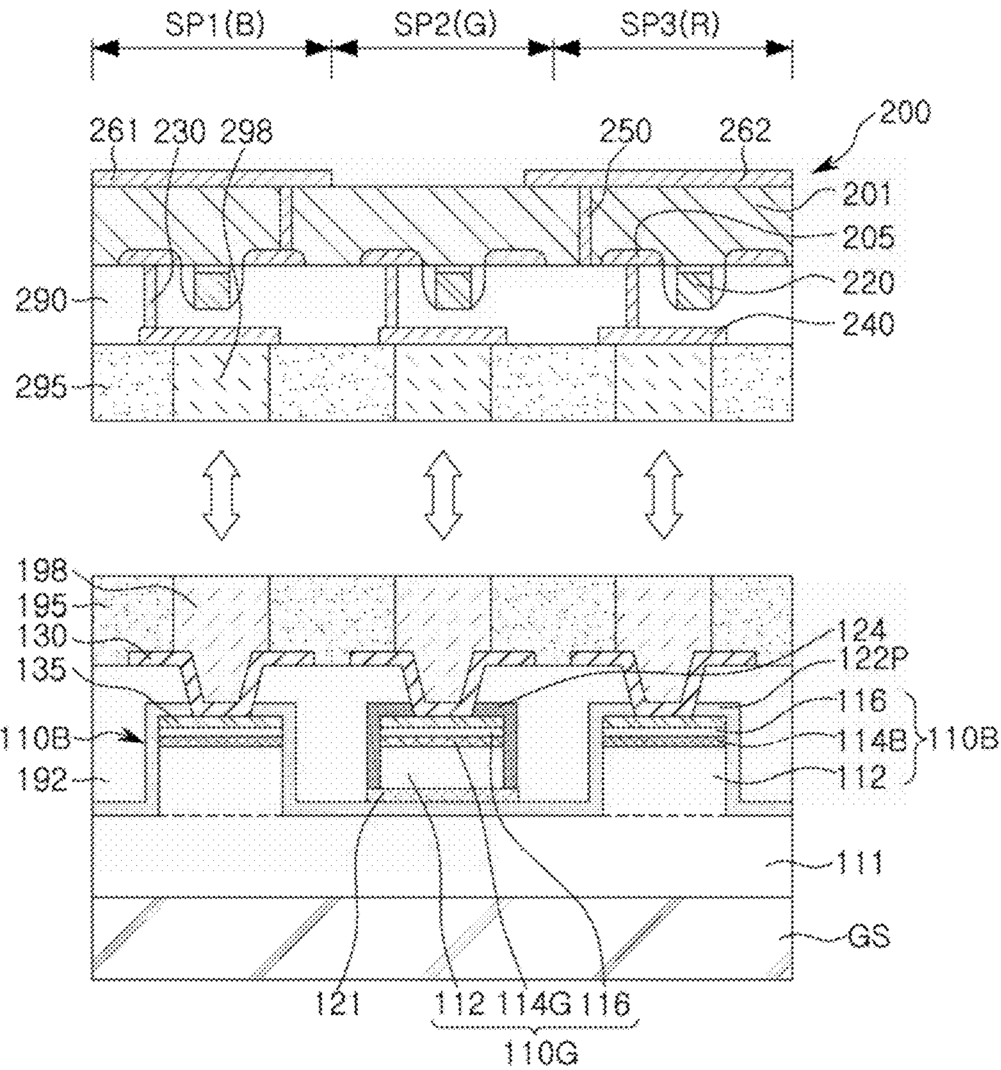

Referring to FIG. 8G, an LED structure including the first and second LED cells 110B and 110G may be bonded to the circuit substrate 200. First, the circuit substrate 200 may be prepared through a separate process. The LED structure and circuit substrate 200 may be bonded to each other on a wafer level by a wafer bonding method, e.g., the hybrid bonding described above. The first bonding electrodes 298 may be bonded to the second bonding electrodes 198, and the first bonding insulating layer 295 may be bonded to the second bonding insulating layer 195. Accordingly, the LED structure and the circuit substrate 200 may be connected to each other without an adhesive layer.

Figure 8H:
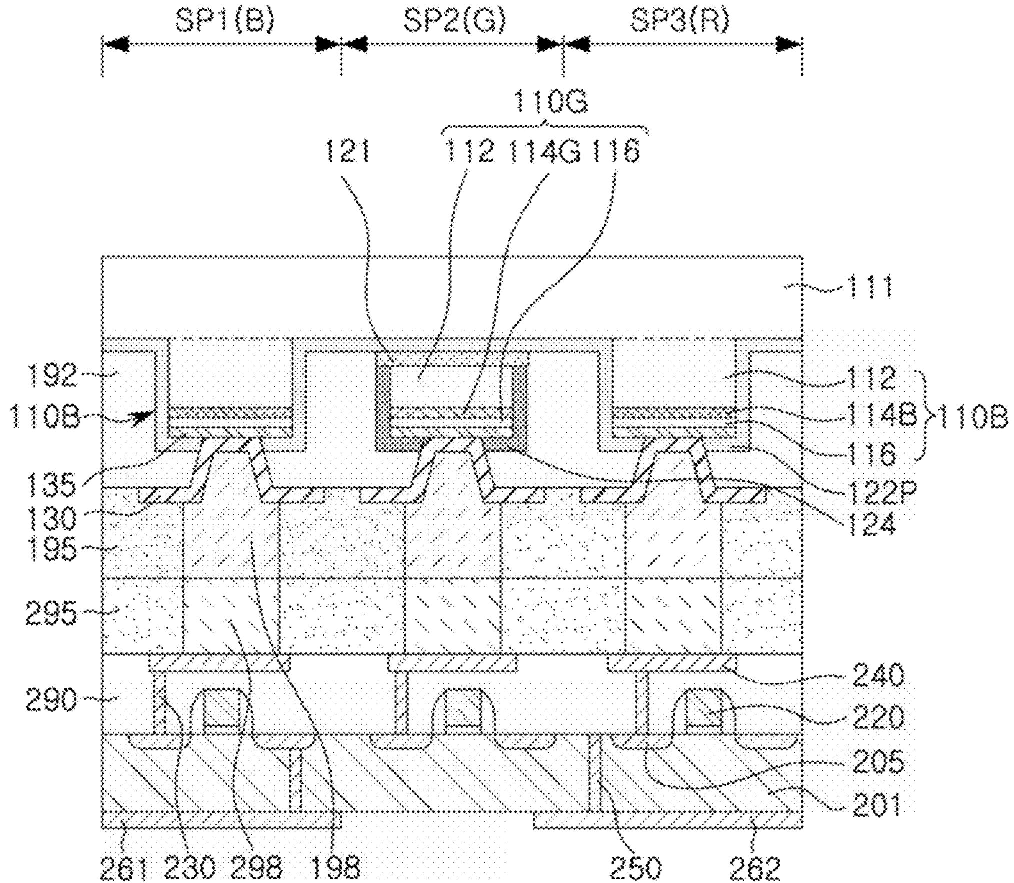

In some example embodiments, the LED structure may not be bonded on the wafer level as such and may be separated into pixel PX units and may be bonded to the circuit substrate 200 by a chip-on-wafer (COW) method. Referring to FIG. 8H, the growth substrate GS may be removed from the base semiconductor layer 111. In the drawings, for ease of description, the LED structure may be in a bonded state in a mirror image shape of the structure illustrated in FIG. 8G. The growth substrate GS may be removed by various processes such as laser lift-off, mechanical polishing, mechanical chemical polishing, or an etching process.

Figure 8I:
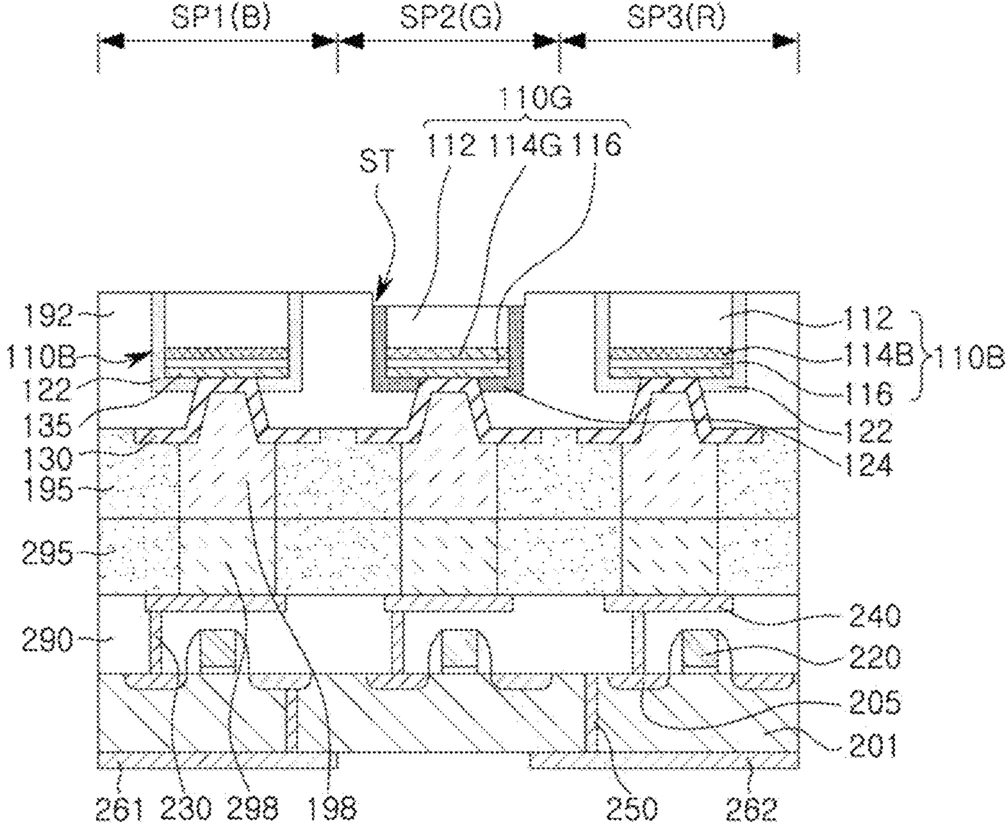

Referring to FIG. 8I, the base semiconductor layer 111 may be removed and the bonding layer 121 may be removed. The base semiconductor layer 111 may be removed using, e.g., a dry etching process or a wet etching process. A portion of the first preliminary passivation layer 122P and the first conductivity-type semiconductor layers 112 exposed after removing the base semiconductor layer 111 may also be removed using a dry etching or wet etching process, and the bonding layer 121 exposed after removing the first preliminary passivation layer 122P may also be removed. Accordingly, a step difference ST may be along a periphery of the second LED cell 110G and the second passivation layer 124. Also, first preliminary passivation layer 122P may be separated, and first passivation layers 122 surrounding side surfaces and lower surfaces of first LED cells 110B may be formed.

Figure 8J:
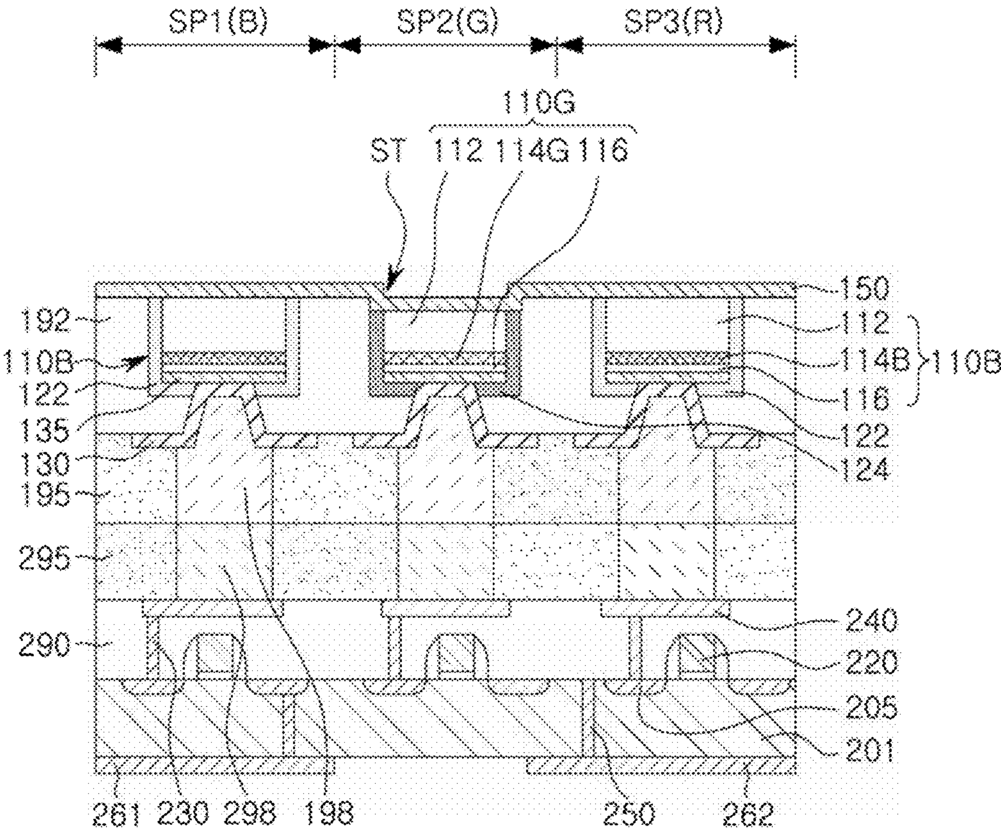

Referring to FIG. 8J, a first electrode 150 may be on the first and second LED cells 110B and 110G. The first electrode 150 may be formed by conformally depositing a transparent electrode material. The first electrode 150 may be a single layer extending horizontally. The first electrode 150 may have a step difference ST along a circumference of the second LED cell 110G and the second passivation layer 124.

Figure 8K:
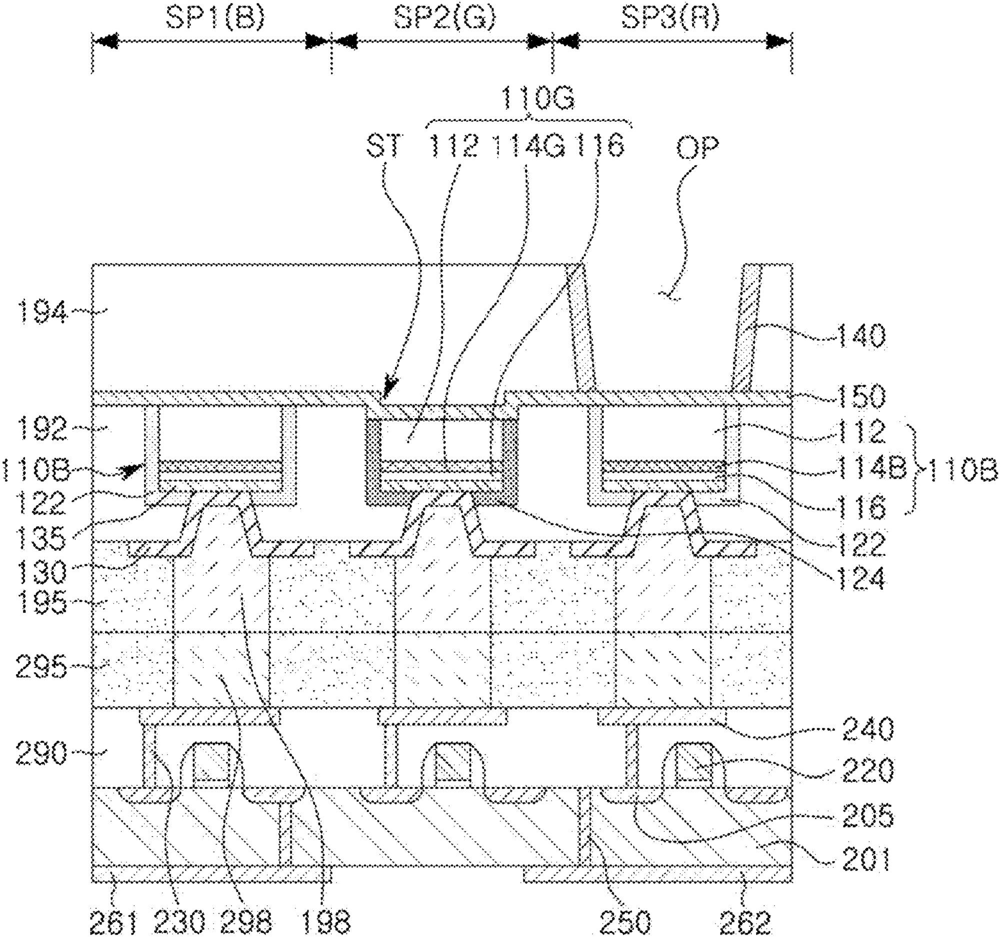

Referring to FIG. 8K, a transparent insulating layer 194 may be on the first electrode 150, an opening OP may be formed, and a reflective layer 140 may be on an internal side surface of the opening OP. The transparent insulating layer 194 may include an inorganic material or an organic material. The opening OP may be formed by removing the transparent insulating layer 194 from the third sub-pixel SP3 in which the wavelength converter 160R is disposed. The reflective layer 140 may be formed by forming a light reflective material along an internal surface of the opening OP and removing the light reflective material from a bottom surface of the opening OP. In an implementation, the opening OP may have a first opening width at the top of the opening OP which is larger than a second opening width at the bottom of the opening OP.

Figure 8L:
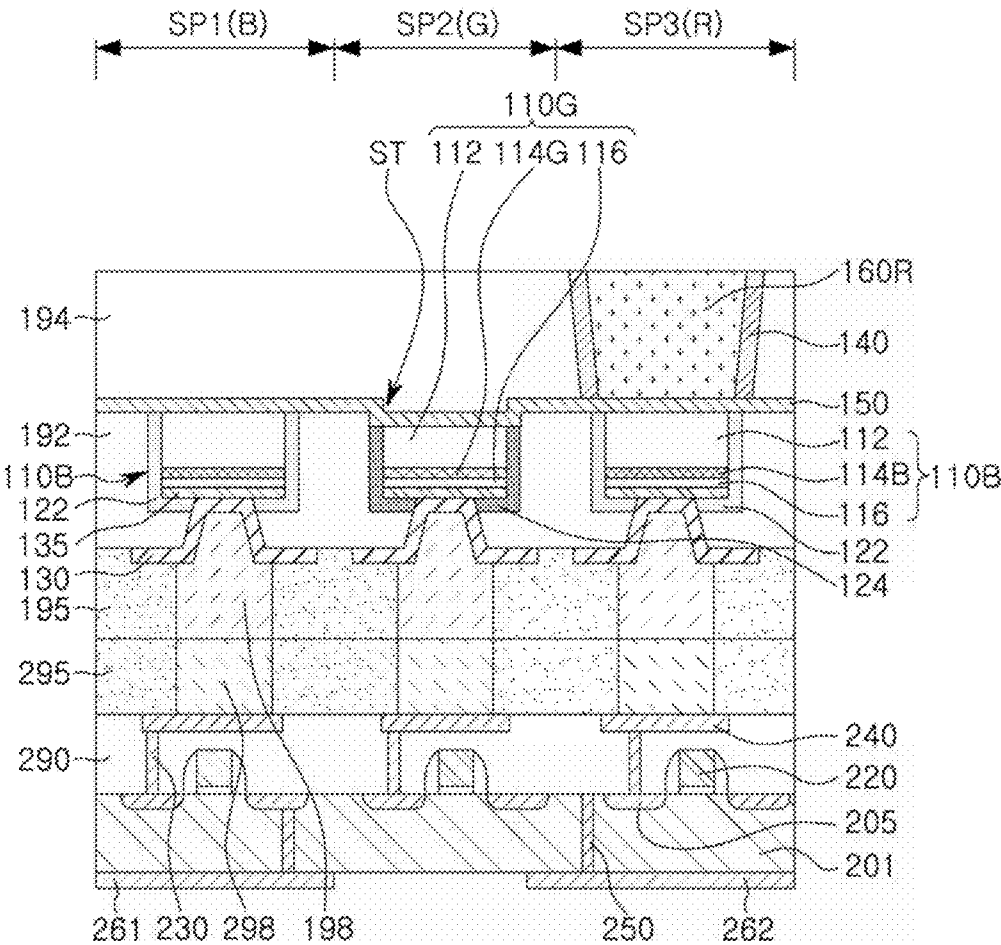

Referring to FIG. 8L, a wavelength converter 160R may be in the opening OP. A wavelength converter 160R may be formed by forming a transparent resin in which a wavelength conversion material is mixed in the opening OP. The wavelength conversion material may convert blue light emitted from the first LED cell 110B into red light. The transparent resin may include, e.g., a transparent resin such as silicone resin or epoxy resin. In some example embodiments, the wavelength converter 160R may be silicon oxide such as $SiO_2$ instead of a transparent resin.

Figure 8M:
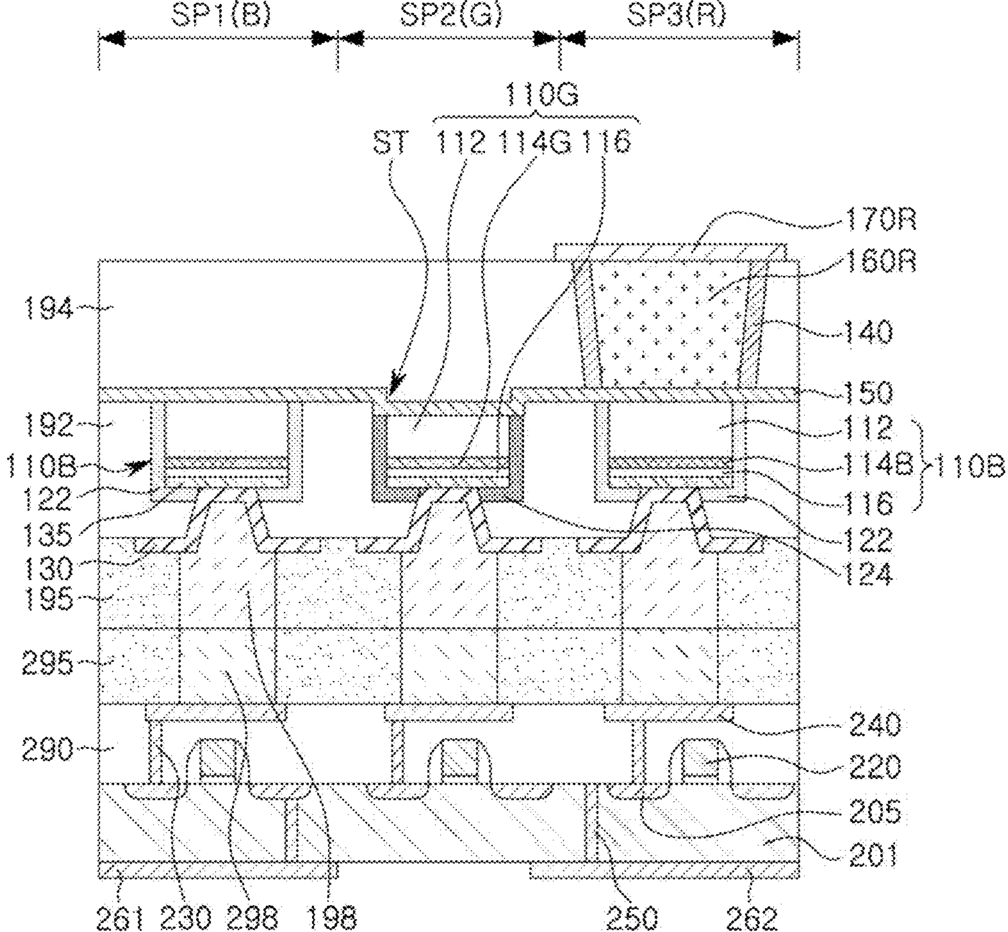

Referring to FIG. 8M, a color filter 170R may be on the wavelength converter 160R. In some example embodiments, an encapsulant layer may be on the wavelength converter 160R, thereafter, the color filter 170R may be formed. In some example embodiments, color filters may be in the first and second sub-pixels SP1 and SP2.

Thereafter, referring to FIG. 3 together, microlenses 180 may be on the color filter 170R. Also, in first and second sub-pixels SP1 and SP2, the microlenses 180 may be on the transparent insulating layer 194. The microlenses 180 may be formed by, e.g., forming a lens material layer formed of a material exposed by using a spray or spin coating process, and directly patterning and reflowing the lens material layer. Alternatively, the microlenses 180 may be formed by forming a lens material layer, forming a mask layer including lens patterns, and transferring the shape of the lens patterns by performing an etching process such as dry-etching on the lens material layer using the mask layer. Thereafter, by dicing the entire structure, the display apparatus 10 in FIG. 3 may be manufactured.

Figure 9:
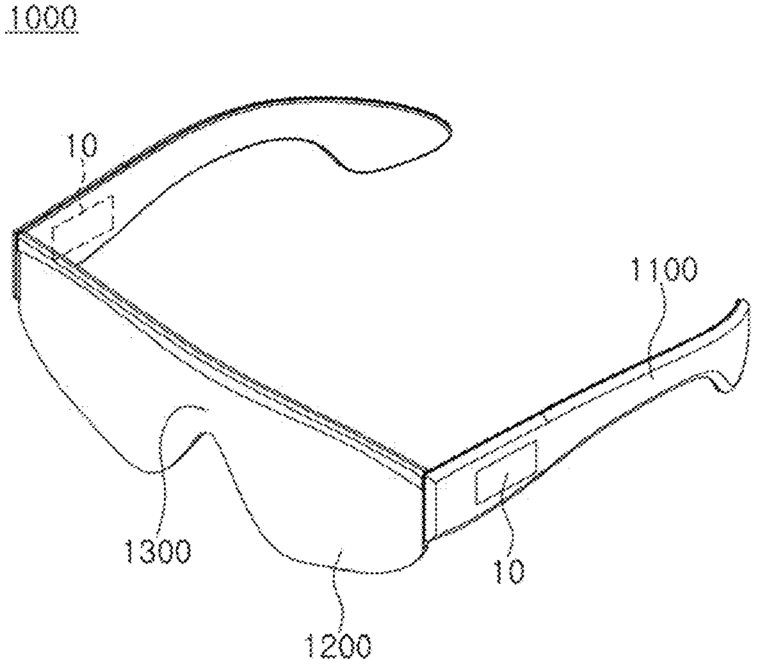
FIG. 9 is a diagram showing an example embodiment of an electronic device including a display apparatus.

FIG. 9 is a diagram showing an example embodiment of an electronic device 1000 including a display apparatus. Referring to FIG. 9, the electronic device 1000 may be implemented as a glasses-type display which may be a wearable device. The electronic device 1000 may include a pair of temples 1100, a pair of light coupling lenses 1200, and a bridge 1300. The electronic device 1000 may further include a display apparatus 10 including an image generator.

The electronic device 1000 may be implemented as a head-mounted, glasses-type, or goggles-type virtual reality (VR) device for providing virtual reality or providing virtual images and external real scenery together, an augmented reality (AR) device, or a mixed reality (MR) device.

The temples 1100 may be spaced apart from each other and may extend in parallel to each other. A display apparatus 10 may be in the temples 1100, and projection lenses may be further disposed. The temples 1100 may be able to be folded towards the bridge 1300 and unfolded away from the bridge 1300. The light coupling lenses 1200 may include a light guide plate and may further include input/output gratings. A bridge 1300 may be provided between the light coupling lenses 1200 and may connect the light coupling lenses 1200 to each other.

The display apparatus 10 may be in each of the temples 1100 and may generate an image in the light coupling lenses 1200. In an implementation, light from the display apparatus 10 may be incident to the projection lenses, may be transmitted along the light guide plate of the light coupling lenses 1200 and may generate an image. The display apparatus 10 may be a display apparatus in the example embodiments described above with reference to FIGS. 1 to 7.

According to the aforementioned example embodiments, by optimizing the electrode structure while arranging a portion of the LED cells by a fluidic transfer method, a display apparatus having high resolution may be provided.

While the example embodiments have been illustrated and described above, it will be configured as apparent to those skilled in the art that modifications, variations, and combinations of the example embodiments could be made without departing from the scope of the present disclosure as defined by the appended claims.

By way of summation and review, a display apparatus including an LED is disclosed. A general display apparatus may mainly include a display panel including a liquid crystal display (LCD) and a backlight, but recently, an LED has been developed to be used as a pixel such that a backlight may not be necessary. Such a display apparatus may be miniaturized and may also implement a high-brightness display apparatus with superior light efficiency as compared to an LCD. An example embodiment of the present disclosure is to provide a display apparatus having high resolution.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:

a circuit substrate including driver circuits and first bonding electrodes; and a pixel array on the circuit substrate and including a plurality of pixels each including first to third sub-pixels, and second bonding electrodes bonded to the first bonding electrodes, the pixel array further including:

a plurality of first LED cells corresponding to the first and third sub-pixels, respectively, and each including a first conductivity-type semiconductor layer, a first active layer, and a second conductivity-type semiconductor layer;

a plurality of second LED cells corresponding to the second sub-pixels, respectively, and each including the first conductivity-type semiconductor layer, a second active layer, and the second conductivity-type semiconductor layer;

a first electrode extending to cover upper surfaces of the plurality of first and second LED cells and connected to the first conductivity-type semiconductor layers in common;

a plurality of second electrodes on lower surfaces of the plurality of first and second LED cells, respectively, and connected to the second conductivity-type semiconductor layers, respectively; and wavelength converters on the first LED cells in the third sub-pixels, wherein a lower surface of the first electrode is on a first level on the plurality of first LED cells and is on a second level lower than the first level on the plurality of second LED cells.

2. The display apparatus as claimed in claim 1, wherein the plurality of second electrodes are on the same level.

3. The display apparatus as claimed in claim 1, wherein an upper surface of the first electrode is on a third level on the plurality of first LED cells and is on a fourth level lower than the third level on the plurality of second LED cells.

4. The display apparatus as claimed in claim 1, wherein the first active layer and the second active layer include materials having different compositions.

5. The display apparatus as claimed in claim 1, wherein the pixel array further includes a transparent insulating layer on the plurality of first and second LED cells on a fifth level corresponding to a level of the wavelength converters in the first and second sub-pixels and not including a wavelength conversion material.

6. The display apparatus as claimed in claim 1, wherein the pixel array further includes a light blocking layer on the first electrode in regions including regions between the plurality of first and second LED cells.

7. The display apparatus as claimed in claim 6, wherein the plurality of first LED cells and the plurality of second LED cells have different widths.

8. The display apparatus as claimed in claim 1, wherein the pixel array further includes reflective layers surrounding side surfaces of the wavelength converters.

9. The display apparatus as claimed in claim 1, wherein the pixel array further includes:

color filters on the wavelength converters; and microlenses on the plurality of first and second LED cells in the first and second sub-pixels and on the color filters in the third sub-pixels.

10. The display apparatus as claimed in claim 1, wherein:

the circuit substrate further includes a first bonding insulating layer surrounding the first bonding electrodes and forming an upper surface of the circuit substrate, and the pixel array further includes a second bonding insulating layer surrounding the second bonding electrodes, forming a lower surface of the pixel array and being bonded to the first bonding insulating layer.

11. The display apparatus as claimed in claim 1, wherein the first to third sub-pixels are arranged in a diamond pentile structure.

12. A display apparatus, comprising:

a circuit substrate including driver circuits; and a pixel array on the circuit substrate and including a plurality of pixels, the pixel array further including:

a plurality of LED cells included in the plurality of pixels;

a first electrode covering upper surfaces of the plurality of LED cells, extending horizontally to a region between the plurality of LED cells, and connected to the plurality of LED cells in common; and a plurality of second electrodes on lower surfaces of the plurality of LED cells, respectively, and connected to the plurality of LED cells, respectively, wherein upper surfaces of a portion of the plurality of LED cells are on a first level, and upper surfaces of the other portion of the plurality of LED cells are on a second level lower than the first level.

13. The display apparatus as claimed in claim 12, wherein the first electrode is a single layer.

14. The display apparatus as claimed in claim 12, wherein:

each of the plurality of pixels includes first to third sub-pixels, the plurality of LED cells include first LED cells corresponding to the first and third sub-pixels, respectively, and second LED cells corresponding to the second sub-pixels, respectively, and each of the first LED cells includes a first active layer, and each of the second LED cells includes a second active layer.

15. The display apparatus as claimed in claim 14, wherein upper surfaces of the first LED cells are on the first level, and upper surfaces of the second LED cells are on the second level.

16. The display apparatus as claimed in claim 12, wherein:

each of the plurality of pixels includes first to third sub-pixels, the plurality of LED cells include first LED cells corresponding to the first sub-pixels, respectively, second LED cells corresponding to the second sub-pixels, respectively, and third LED cells corresponding to the third sub-pixels, respectively, and each of the first LED cells includes a first active layer, each of the second LED cells includes a second active layer, and each of the third LED cells includes a third active layer.

17. The display apparatus as claimed in claim 16, wherein upper surfaces of the first LED cells are on the first level, and upper surfaces of at least one of the second LED cells and the third LED cells are on the second level.

18. The display apparatus as claimed in claim 12, wherein the first electrode includes regions having different thicknesses.

19. A display apparatus, comprising:

a circuit substrate including driver circuits; and a pixel array on the circuit substrate and including a plurality of pixels each including first to third sub-pixels, the pixel array further including:

a plurality of LED cells corresponding to the first and third sub-pixels, respectively;

a first electrode extending to cover upper surfaces of the plurality of LED cells and connected to the plurality of LED cells in common; and a plurality of second electrodes on lower surfaces of the plurality of LED cells, respectively, and connected to the plurality of LED cells, respectively, wherein:

a lower surface of the first electrode is on a first level on a portion of the plurality of LED cells, and is on a second level lower than the first level on a portion of the plurality of LED cells, and lower surfaces of the plurality of second electrodes are on the same level.

20. The display apparatus as claimed in claim 19, wherein the pixel array further includes wavelength converters on at least a portion of the plurality of LED cells in the first level.

* * * * *